United States Patent [19]

Ryan

[11] Patent Number: 5,749,086
[45] Date of Patent: May 5, 1998

[54] SIMPLIFIED CLOCKED DRAM WITH A FAST COMMAND INPUT

[75] Inventor: Kevin J. Ryan, Meridian, Id.

[73] Assignee: Micron Technology, Inc., Boise, Id.

[21] Appl. No.: 608,661

[22] Filed: Feb. 29, 1996

[51] Int. Cl.$^6$ .................................................. G06F 12/02
[52] U.S. Cl. ........................... 711/105; 365/189.03
[58] Field of Search ........................... 365/189.03, 193, 365/233; 395/432, 433

[56] References Cited

U.S. PATENT DOCUMENTS

| | | | |
|---|---|---|---|
| 4,734,880 | 3/1988 | Collins | 395/432 |
| 5,457,659 | 10/1995 | Schaefer | 365/222 |
| 5,467,314 | 11/1995 | Miyazawa | 365/201 |
| 5,511,024 | 4/1996 | Ware | 365/189.04 |
| 5,521,879 | 5/1996 | Takasugi | 365/233 |
| 5,544,124 | 8/1996 | Zagar | 365/230.08 |
| 5,566,119 | 10/1996 | Matano | 365/222 |

FOREIGN PATENT DOCUMENTS

| | | |
|---|---|---|
| 0 623 931 A2 | 11/1994 | European Pat. Off. |
| 0 640 981 A2 | 3/1995 | European Pat. Off. |

OTHER PUBLICATIONS

1996 DRAM Data Book Micro Technology Inc, pp. 3-8-3-13, 1995.

*Primary Examiner*—Tod R. Swann
*Assistant Examiner*—Christopher S. Chow
*Attorney, Agent, or Firm*—Seed and Berry LLP

[57] ABSTRACT

A synchronous memory device is described which is a relatively uncomplicated modification of an asynchronous DRAM such as a Burst Extended Data Out (BEDO) DRAM. The memory device receives the system clock signal, which provides many of those functions associated with the well known command signal CAS in asynchronous DRAMs. Chip and row select functions are controlled by the well known command signal RAS. Novel command signals CMND0 and CMND1 are supplied in place of the well known WE and OE command signals. The novel command signals are sampled at RAS time, at which time distinct combinations of the logic values of CMND0 and CMND1 represent distinct operating mode commands, such as Read, Write and Refresh. At each positive system clock edge following RAS time, the distinct combinations of the logic values of CMND0 and CMND1 represent distinct commands such as NOP, Switch Mode, and Latch Address. Full write command interrupt and/or byte-write capability can be provided, as desired.

40 Claims, 21 Drawing Sheets

CAS-BEFORE-RAS (or AUTO-REFRESH)
equivalent using an internally generated address.

BURST READ THEN IDLE

BURST READ INTERRUPTED BY PRECHARGE

SUCCESSIVE READ BURSTS

BURST READ FOLLOWED BY WRITE (MODE SWITCH)

BURST READ INTERRUPTED BY WRITE (MODE SWITCH)

BURST WRITE THEN CLOSE PAGE

BURST WRITE THEN IDLE

WRITE BURST INTERRUPTED BY PRECHARGE

BURST WRITE FOLLOWED BY BURST WRITE

BURST WRITE FOLLOWED BY READ (MODE SWITCH)

BURST WRITE INTERRUPTED BY READ (MODE SWITCH)

BURST WRITE INTERRUPTED BY READ (MODE SWITCH) THEN SWITCHED BACK AND LEFT IDLE 5,749,086

1

SIMPLIFIED CLOCKED DRAM WITH A FAST COMMAND INPUT

DESCRIPTION

1. Technical Field

This invention relates generally to electronic devices, and more particularly to memory devices and methods for transferring data to and from such memory devices.

2. Background of the Invention

Computer designers are always searching for faster memory devices that will allow them to design faster computers. A significant limitation on a computer's operating speed is the time required to transfer data between a processor and a memory circuit, such as a read or write data transfer. Memory circuits, such as a dynamic random access memories (DRAMs), usually include a large number of memory cells arranged in one or more arrays, each having rows and columns. The memory cells provide locations at which the processor can store and retrieve data. The more quickly the processor can access the data within the memory cells, the more quickly it can perform a calculation or execute a program using the data.

FIG. 1 shows, in part, a typical computer system architecture. A central processing unit (CPU) or processor 50 is connected to a bus set 52, which in turn is connected to a system or memory controller 54 and a datapath integrated circuit (IC) 56. The memory controller 54 and datapath IC 56 serve as interface circuitry between the processor 50 and a memory 60. The processor issues a command C and an address A which are received and translated by the memory controller 54, which in turn applies command signals on a plurality of command lines 58 and an address on an address bus 59 to the memory 60. These command signals are well known in the art and include RAS (row address strobe), CAS (column address strobe), WE (write enable) and OE (output enable). Corresponding to the processor-issued commands C and addresses A, data D is transferred between the processor 50 and the memory 60 via the datapath IC 56 and a memory data bus 61.

The memory 60 typically comprises a number of memory banks 62, a representative one of which is depicted in FIG. 2. In this example, the memory bank 62 is configured for a 32-bit system, having four 8-bit memory component devices 64(0)–64(3). Four distinct CAS command signals (CAS0–CAS3) are depicted, one for each of the 8-bit devices 64. Hence, the command signal CAS is often referred to as a byte-specific command signal. A byte-specific command signal offers the advantage of a relatively lightly loaded command line with minimal propagation delays and skew at a cost of an increased number of pins and complexity at the controller 54 (see FIG. 1). The command signal RAS is applied to all component devices 64 in the bank 62. In a memory 60 having additional banks (not shown), separate RAS command signals would be provided for each bank. Hence, the command signal RAS is often referred to as a bank-specific command signal. The address bus 59 is connected to all component devices 64 in the bank 62 and to all other component devices (not shown) in all other banks (not shown) of the memory 60. Hence, the address bus 59 is often referred to as globally connected. A globally connected line has the attendant disadvantages of a heavily loaded line, but saves on extra pins and complexity at the controller 54. Typically, command signals WE and OE are carried on global command lines.

Referring again to FIG. 1, a system clock (not shown) provides a signal CLK to the processor 50 and the controller

2

54. The processor 50 issues commands C, addresses A, and provides or receives data D at precise time intervals (typically at a positive clock signal CLK transition) as controlled by the system clock. However, most commercially available DRAMs are asynchronous, meaning that the memory 60 itself neither directly receives nor responds to the system clock signal CLK. Instead, the memory 60 responds solely to the command signals produced by the memory controller 54. Although, the controller 54 initiates command signals in response to the system clock and processor commands, there is an intrinsic delay between initiation of command signals and application of the command signals to the memory 60. Also, in the case of a data read, the data retrieved from the memory 60 must be temporally aligned with the system clock for the processor 50 to properly read it. The propagation delays associated with the required generation of command signals and the data path temporal alignment delays significantly limit system performance.

A number of performance improvements have been implemented in asynchronous DRAMs. For example, page-oriented DRAMS have replaced traditional random access DRAMs in a number of applications. In a conventional random access data transfer cycle, an addressed row of memory cells is activated in response to the RAS command signal, and a single addressed column is accessed in response to the CAS command signal (the state of the WE and OE command signals determine whether the data transfer is a read or write operation). In contrast, page-oriented memory devices are employed to minimize the number of distinct command signals necessary to retrieve larger amounts of data. When a memory device is operated in a page mode cycle, an addressed row of memory cells is activated in response to the RAS command signal, and a toggling of the byte-specific CAS command signals results in data transfers at a large number (sometimes all) of the columns in that row before completion of the data transfer cycle. In addition to the toggling of CAS, however, the heavily loaded global address bus must be driven to rapidly provide the various column addresses which are strobed in by CAS. Nevertheless, the average cycle time per data transfer can be significantly less in a page-oriented memory device than a random access device.

A further improvement on conventional page-oriented memory device is provided by an address burst counter internal to the memory device. Given a single column address, the burst counter provides the next column addresses in sequence, which avoids the necessity of rapidly driving the heavily loaded address bus. The command signal CAS is still toggled, as usual, to latch the column addresses. Other improvements are provided by pipelining data transfer cycles, in which the memory 60 is configured so as to allow the initiation of a subsequent data transfer cycle before completion of a prior cycle. Still other improvements can be provided at the system architecture level by providing a data command signal DCS from the controller 54 to the datapath IC 56 to help facilitate the temporal alignment of read accessed data elements with the system clock (see FIG. 1). However, none of the computer system architectures having asynchronous DRAMs can overcome the fundamental problems associated with command signal development delay.

Synchronous DRAMs, in which the memory receives the system clock signal and directly responds to the clock signal have been defined to overcome the problems associated with command signal development delay. However, the synchronous DRAMs defined by industry agreement include a number of specialized functions adding several newly defined pins, and are costly to manufacture because of the larger required die size. As a result, currently available synchronous DRAMs have not been a great commercial success.

SUMMARY OF THE INVENTION

According to the present invention, a synchronous memory device is constructed by modifying an existing asynchronous DRAM such as a Burst Extended Data Out (BEDO) DRAM. The memory device receives a system clock signal, which provides many of those functions associated with the well known command signal CAS in asynchronous DRAMs. Chip and row select functions are controlled by the well known command signal RAS. Novel command signals CMND0 and CMND1 are supplied in place of the well known WE and OE command signals. The novel command signals are sampled at RAS time, at which time distinct combinations of the logic values of CMND0 and CMND1 represent distinct operating mode commands, such as Read, Write and Refresh. At each positive system clock edge following RAS time, the distinct combinations of the logic values of CMND0 and CMND1 represent distinct commands such as NOP, Switch Mode, and Latch Address. In the preferred embodiment, CMND1 is a byte-specific command and CMND0 is a global command, representing a compromise between bus efficiency and memory controller pin count and complexity. In the preferred embodiment, read and write burst interrupt is provided. Alternatively, byte-write capability can be substituted for the write command interrupt feature.

According to the present invention, data is transferred between a processor and a memory device having an array of memory cells arranged in rows and columns. A system clock signal, a row activation signal, and first and second command signals are applied to a control circuit of the memory device. The row activation signal has two logical values, as does each of the first and second command signals. The row activation signal is sampled by the control circuit at regular time intervals determined by the system clock signal. Responsive to a sampled first logical value of the row activation signal, the control circuit produces one or more control signals to initiate activation of an addressed row of memory cells. The control circuit produces one or more control signals to initiate one of a plurality of memory device operating modes (such as Read or Write) in response to one of a plurality of combinations of sampled logical values of the first and second command signals. Subsequently, the control circuit produces one or more control signals corresponding to one of a plurality of memory device commands (such as Switch Mode, NOP, or Latch Address) in response to one of the plurality of combinations of sampled logical values of the first and second command signals.

DETAILED DESCRIPTION OF THE PREFERRED EMBODIMENT

Figure 3:
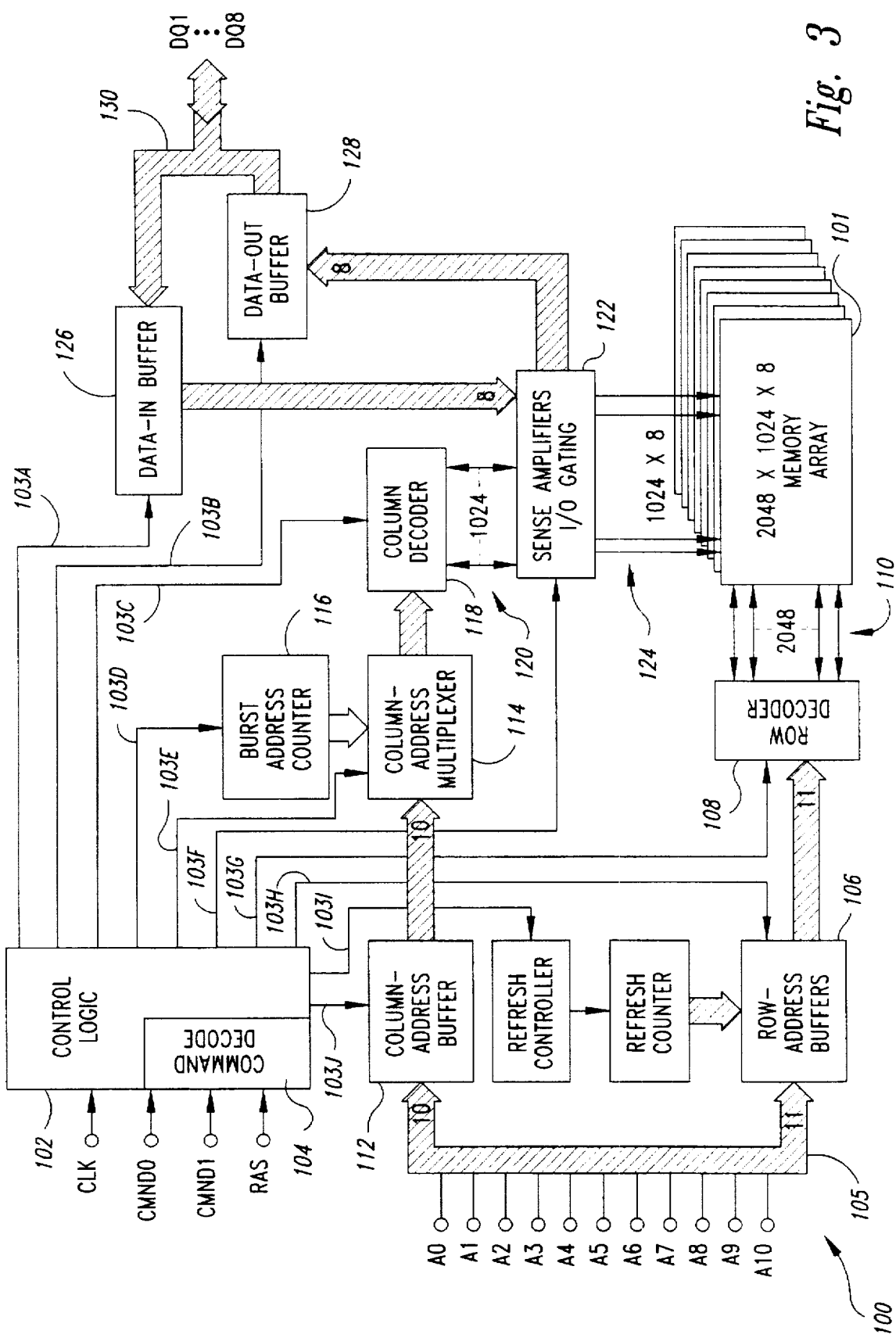
FIG. 3 is a functional block diagram of a memory device according to the present invention.

FIG. 3 shows a functional block diagram of a memory device 100 according to the present invention. The memory device 100 includes as its central memory element a memory array 101, and operates under the control of a control logic circuit 102. The memory array 101 includes a plurality of memory cells (not shown) arranged in rows and columns. In one embodiment of the invention, the memory device 100 has an 8-bit word width—meaning that to each specified memory address (combined row and column address) there is a one-to-one correspondence with 8 memory cells in the array 101.

A system clock (not shown) provides a signal CLK to the control circuit 102 of the memory device 100, as well as to the processor and/or other addressing circuitry (such as a memory controller) accessing the memory device. Command signals input to the control circuit 102 are decoded by command decode circuitry 104. These command signals include RAS, well known in the art, and two novel command signals CMND0 and CMND1 which are discussed in detail below. Many of the functions associated with the well known CAS command signal are instead provided by the system clock signal CLK. Additionally, the well known WE and OE commands lines are absent, having been substituted by the novel commands CMND0 and CMND1. Corresponding to the applied sequence/combination of command signals, the control circuit 102 sends control signals on control lines 103A–J to other parts of the memory device 100, controlling the timing of access to the memory cells in array 101. The memory device according to the present invention can be implemented by relatively uncomplicated modifications of existing asynchronous DRAMs, such as Burst Extended Data Out (BEDO) DRAMs. As such, a primary advantage of the present invention is that it provides the high performance capability of synchronous DRAMs, but with the cost effective manufacturing of asynchronous DRAMs. A further advantage associated with the relatively uncomplicated modifications of existing asynchronous DRAMs is that fully synchronous performance is provided without requiring unduly increased complexity at the memory controller.

An address is applied to the memory device 100 on an address bus 105. The address includes a row address and a column address, which are preferably applied to the memory device 100 sequentially. In response to one or more control signals provided by the control circuit 102, row address buffer circuitry 106 takes a row address and provides it to a row decode circuit 108. In response to one or more control signals provided by the control circuit 102, the row decode circuit takes a row address and activates a selected row of memory cells (not shown) in the memory array 101 by selecting one of several row access lines 110. In response to one or more control signals provided by the control circuit 102, column address buffer circuitry 112 takes a column address and provides it to a column address mux 114. The column address mux 114 also receives addressing information from an address burst counter 116 which functions responsive to one or more control signals provided by the control circuit 102. In one embodiment, the burst counter 116 permutes the two least significant bits of the column address to provide a total of four distinct (and logically adjacent) column addresses. In response to one or more control signals provided by the control circuit 102, the column address mux 114 provides a column address to a column decode circuit 118. In response to one or more control signals provided by the control circuit 102, the column decode circuit 118 selects one of several column access lines 120, each of which is coupled to the memory array 101 by an I/O interface circuit 122. In response to one or more control signals provided by the control circuit 102, the I/O interface circuit 122 selects the memory cell(s) corresponding to the column location in an activated row via bit lines 124. The I/O interface circuits 122 include sense amplifiers (not shown) which determine and amplify the logic state of the selected memory cells, and I/O gating circuitry (not shown) which receives data from a data input buffer 126 and sends data to a data output buffer 128. The data buffers 126 and 128 are connected to a data bus 130 and are used to input and output data to and from the memory device 100, responsive to control signals provided by the control circuit 102.

The command signals RAS, CMND0 and CMND1 are synchronized with the system clock signal CLK. The RAS command signal initiates cycles and acts as a row activation signal, much like traditional asynchronous DRAMs. CMND0 and CMND1 are sampled at every positive clock signal transition at which RAS is sampled low. CMND0 and CMND1 are then decoded to control the internal DRAM circuitry.

Figure 4:
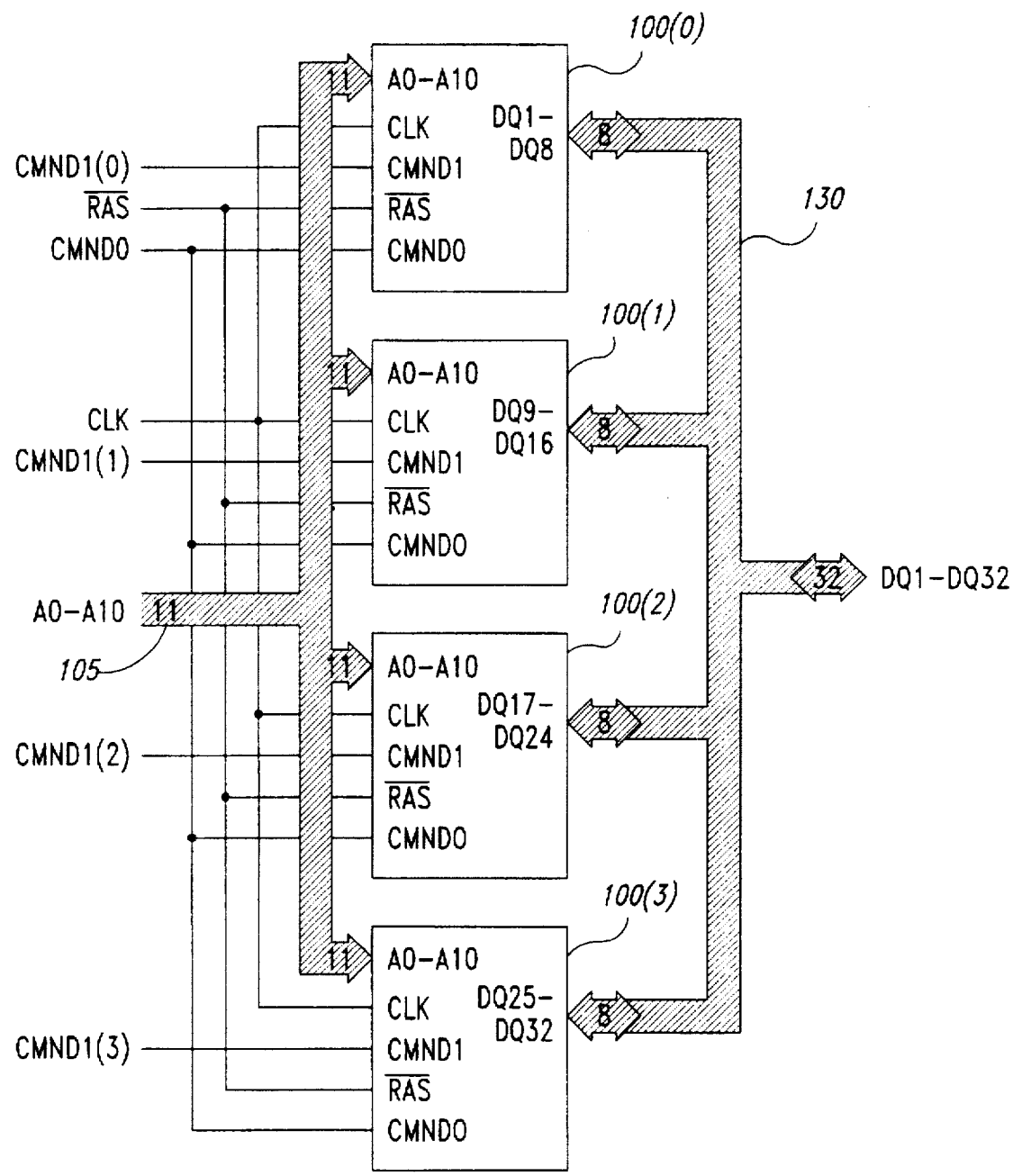
FIG. 4 is a block diagram of a bank of memory devices according to the present invention.

FIG. 4 shows a block diagram of a bank of four memory devices 100(0)–100(3) according to the present invention. The bank is configured for a 32-bit system, with RAS functioning conventionally as a bank-specific command. The command signal CMND1 functions as a byte-specific command, wherein four distinct signals CMND1(0) –CMND1(3) are associated with memory devices 100(0) –100(3) and data bytes DQ1–DQ8, DQ9–DQ16, DQ17–DQ24 and DQ25–DQ32, all respectively. The clock signal CLK and the command signal CMND0 are connected globally, as is the address bus 105. Providing the byte-specific command CMND1 allows rapid toggling of the lightly loaded command line, but at a cost of increased number of pins and complexity at the memory controller (not shown). Providing the global command CMND0 saves on the number of pins and complexity at the memory controller, but at a cost of increased propagation delay and skew on the heavily loaded command line. Providing command signals on both byte-specific and global command lines represents a compromise between controller pin count and bus efficiency.

Both command signals CMND0 and CMND1 are sampled at RAS time—i.e., the first transition of the system clock signal CLK from low to high (known as a "positive clock edge") after RAS transitions from high to low, at which time activation of a row of memory cells is initiated. Distinct combinations of the values of the CMND0 and CMND1 signals represent distinct operating mode commands. The command decode circuitry 104 (see FIG. 3) of the control circuit 102 samples CMND0 and CMND1 and the control circuit then produces control signals corresponding to the selected operating mode. Table 1 shows the operating mode associated with the values of CMND0 and CMND1 at RAS time, with "1" representing a logic high value and "0" a logic low value.

TABLE 1

| CMND1 | CMND0 | MODE |
| --- | --- | --- |
| 0 | 0 | Read |
| 0 | 1 | Write |
| 1 | 0 | Reserved |
| 1 | 1 | Refresh |

If a Read or Write mode is selected at RAS time, the definition of operating commands associated with values of CMND0 and CMND1 is changed when sampled at subsequent positive clock edges. Table 2 shows the operating command associated with the values of CMND0 and CMND1 at any positive clock edge after Read or Write mode is selected at RAS time.

TABLE 2

| CMND1 | CMND0 | READ MODE | WRITE MODE |
| --- | --- | --- | --- |
| 0 | X | NOP/Continue Burst | NOP/Continue Burst |
| 1 | 0 | Switch Mode, Wait for Next Command | Switch Mode, Latch Address |
| 1 | 1 | Latch Address, Start Read Burst | Latch Address, Latch First Data, Start Write Burst |

Because the CMND0 signal is carried on a global command line, a transitioning CMND0 may not be valid within a single clock cycle. Thus, as seen in Table 2, CMND0 is ignored at any positive clock edge when byte-specific CMND1 is sampled low after RAS time.

Figure 1:
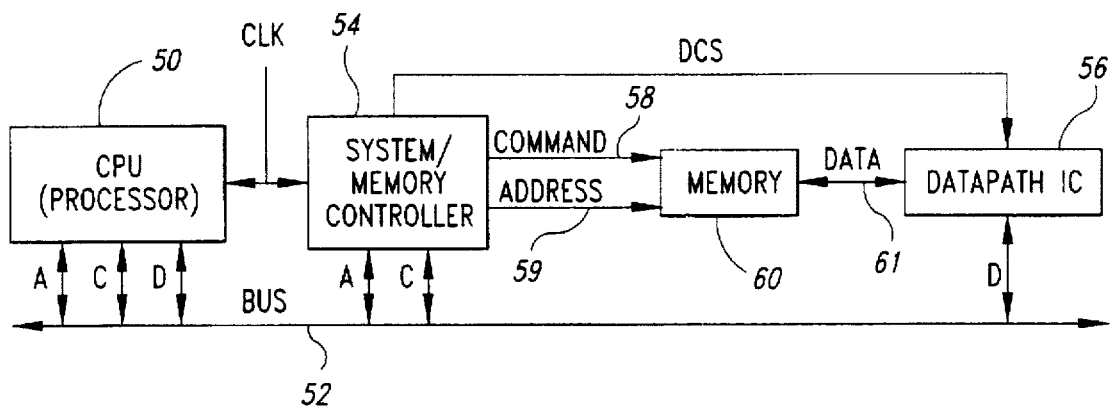
FIG. 1 is a functional block diagram of a prior art computer system architecture.

A number of advantages result from allowing the definition of the operating commands associated with the values of CMND0 and CMND1 to change as shown in Tables 1 and 2. Many distinct commands can be coded with just two command signals having four distinct logic value combinations. This results, for example, in a significant savings in the required complexity and pin count of both the memory device 100 and especially the external memory controller (see FIG. 1) or other circuitry addressing the memory device. Controller complexity is also lessened by selecting Read or Write operating mode at RAS time, rather than subsequently as is conventionally done.

Figure 5:
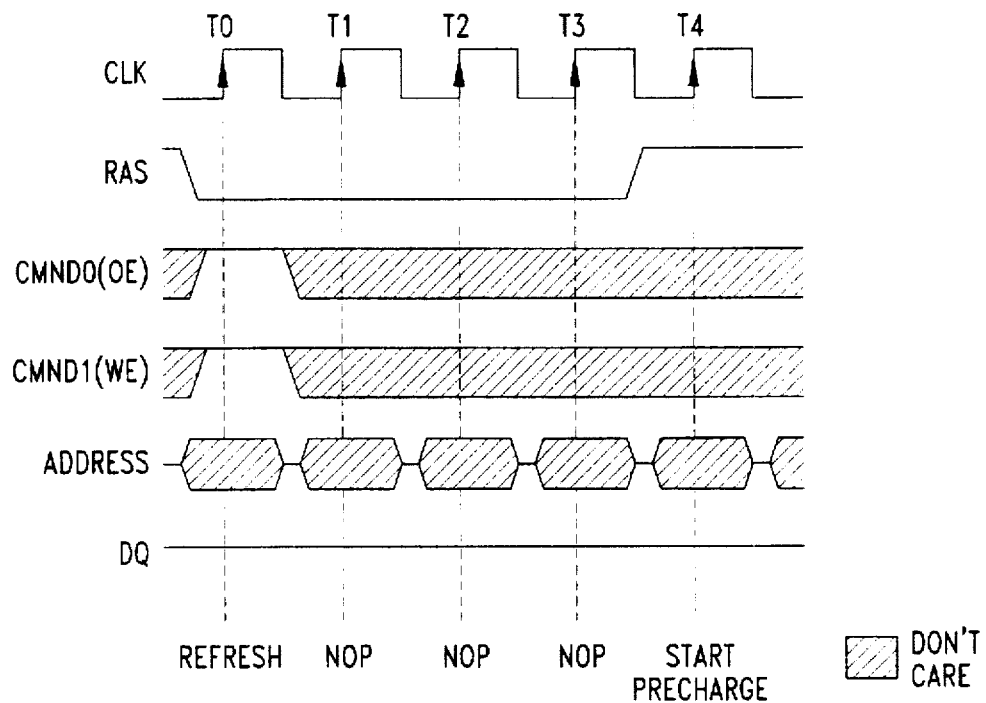
FIG. 5 is a timing diagram showing a refresh operation in the memory device of FIG. 3.
Figure 2:
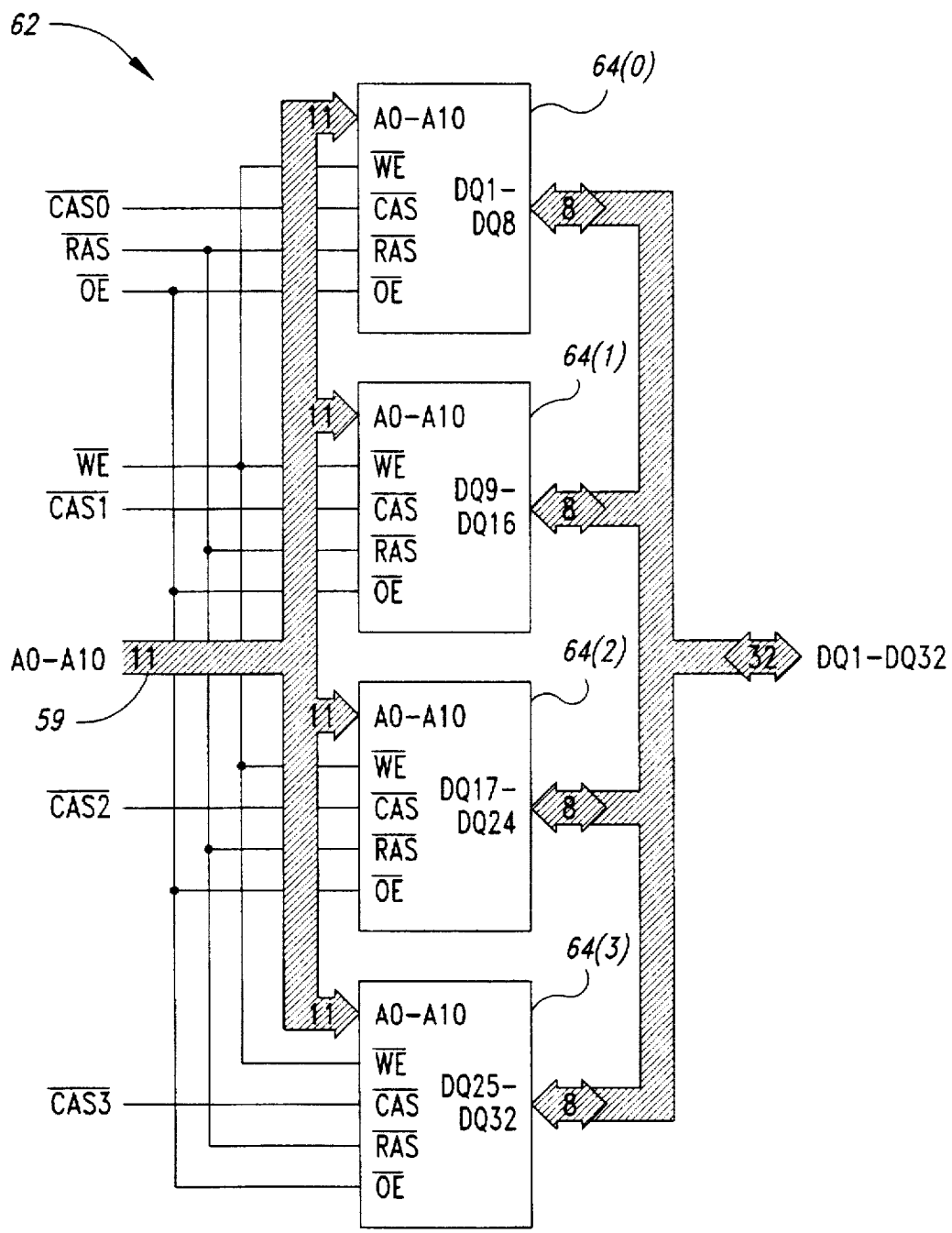
FIG. 2 is a block diagram of a prior art bank of memory devices.

FIGS. 5-21 are timing diagrams showing the system clock signal CLK with leading or positive clock edges occurring at times T0, T1, T2, etc.; the state of command signals RAS, CMND0 and CMND1 registered in the memory device 100 of FIG. 3 at times corresponding to leading edges of the CLK signal; the row and column addresses provided to the memory device on the address bus 105 and registered in the memory device 100 at times corresponding to leading edges of the CLK signal, and, the state of the data bus 130 on which data is output (DOUT) or input (DIN) to the memory device at a time corresponding to a leading edge of the CLK signal. The depicted parameters in FIGS. 5-21 are representative of the current state of the art corresponding to today's clock speeds of 50-100 MHz: a row activation time $t_{RCD}$ is 3 clock cycles, a write recovery time teat (the time between registration in the memory device of input data DIN and the availability of the write-accessed row for the row deactivation precharge step) is 1 clock cycle, and a read latency (the time between registration in the memory device of the column address to be accessed and the availability of the accessed data on the data bus) is 3 clock cycles As depicted in the timing diagram of FIG. 5, a refresh cycle consists of a RAS active time (RAS low) and a RAS precharge time (RAS high) as is conventional in asynchronous DRAMs. At RAS time T0, CMND0 and CMND1 are each sampled high and a refresh cycle is initiated. The preferred refresh method is the conventional CAS-BEFORE-RAS or AUTO-REFRESH method with internally generated row addresses (hence the state of the address bus in FIG. 5 is "Don't Care"). The reserved slot in Table 1 above could be used, together with the address inputs, to define a second refresh method as desired.

Figure 6:
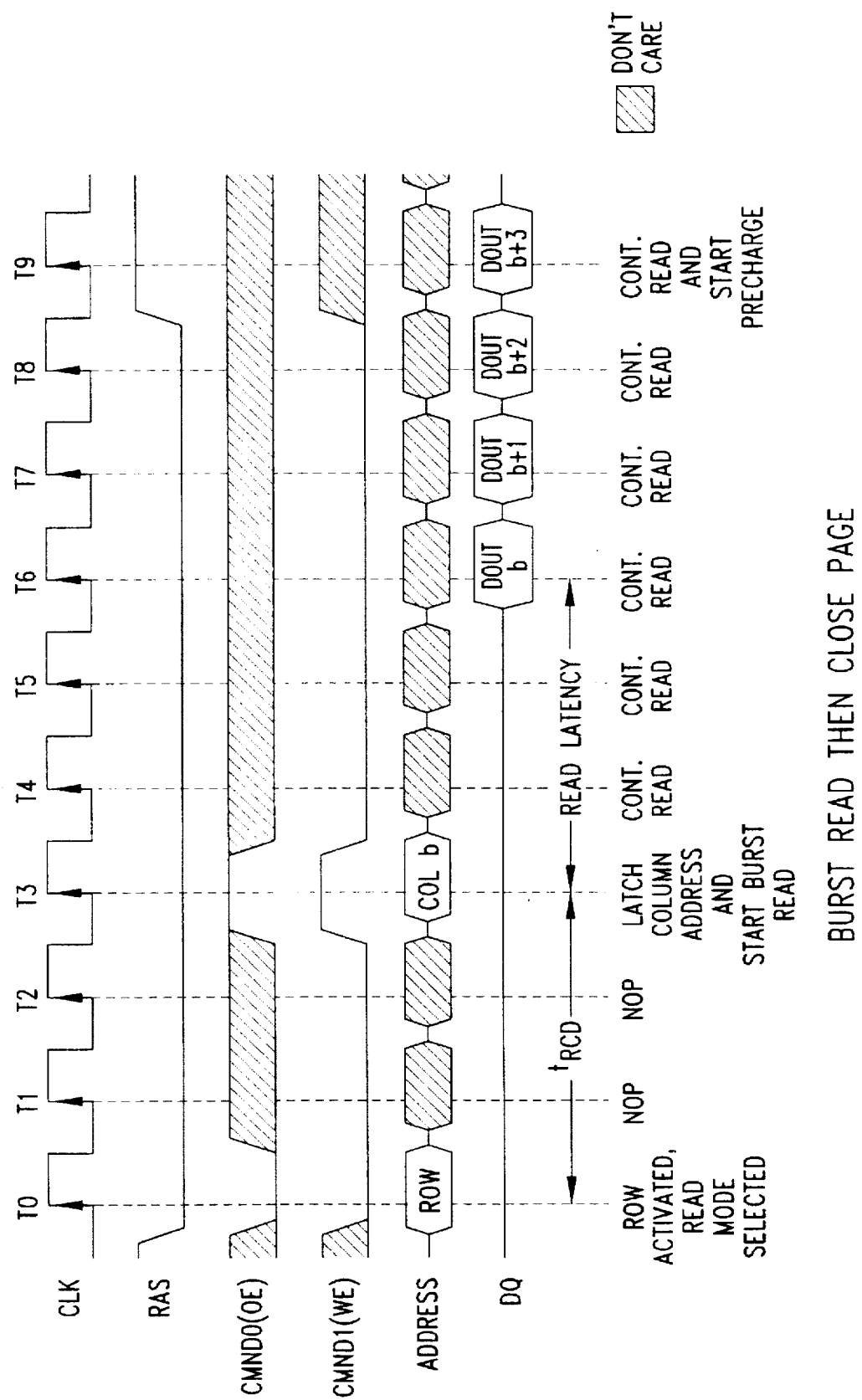
FIG. 6 is a timing diagram showing a Read Burst followed by a precharge operation in the memory device of FIG. 3.
Figure 7:
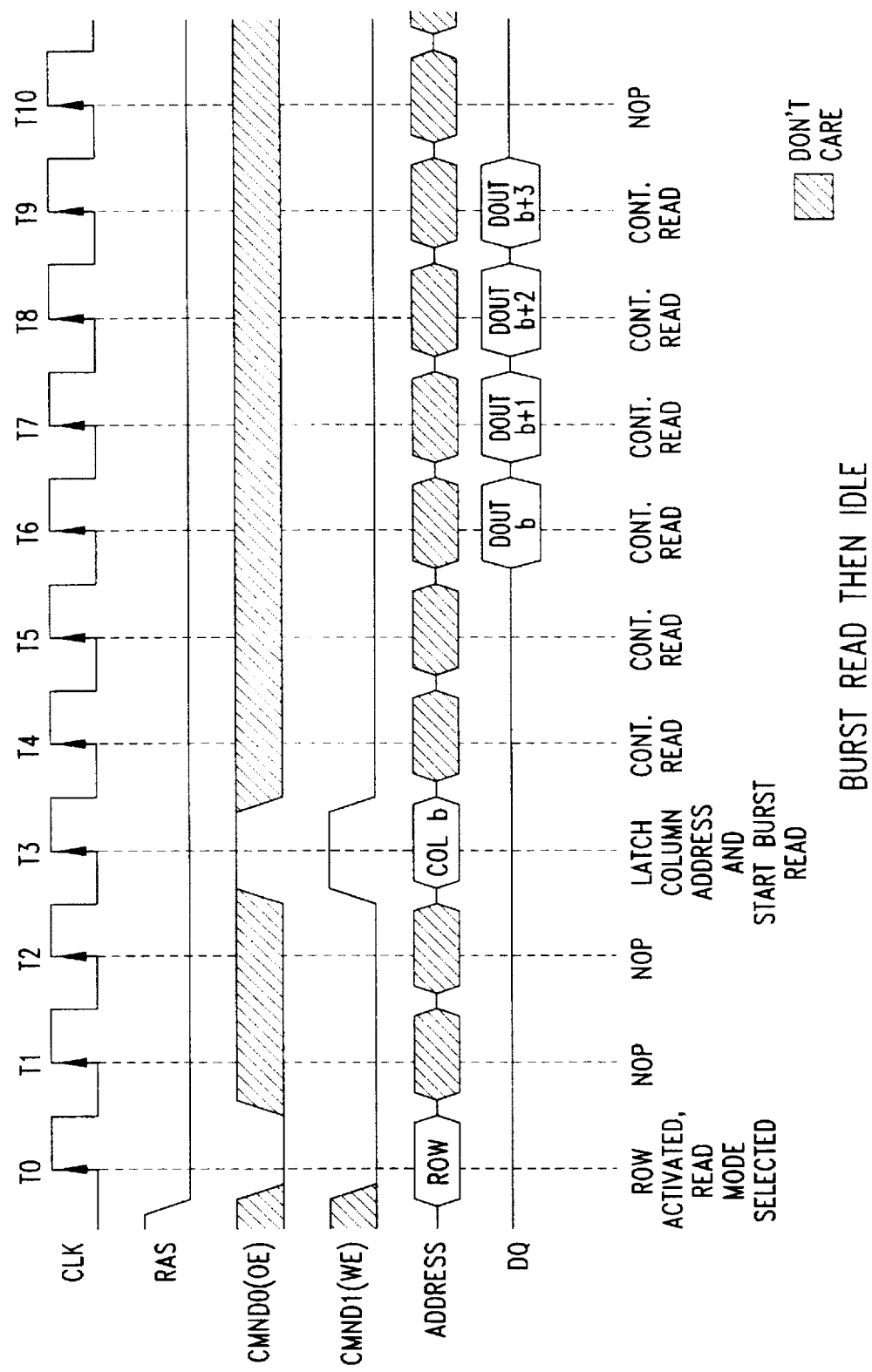
FIG. 7 is a timing diagram showing a Read Burst followed by an idle state in the memory device of FIG. 3.
Figure 8:
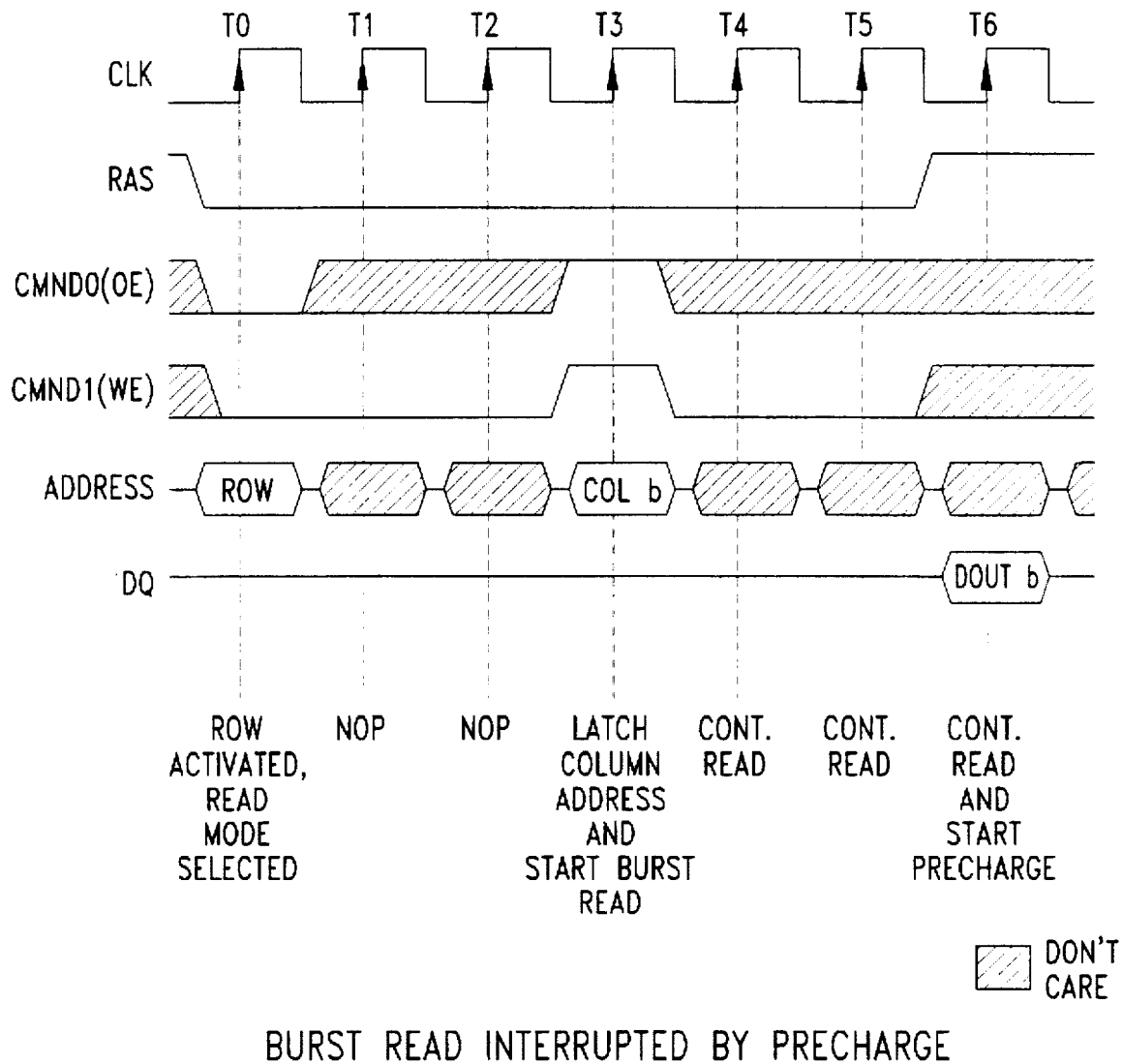
FIG. 8 is a timing diagram showing a Read Burst terminated by a precharge operation in the memory device of FIG. 3.

Referring to FIGS. 3 and 6, a Read Burst will now be described. At RAS time T0, a ROW address is provided on the address bus 105 and activation of a corresponding row of memory cells in the memory array 101 is initiated. Also at RAS time T0, the values of CMND0 and CMND1 are each sampled low by the command decode circuitry 104, causing the subsequent operation of the memory device 100 in Read mode. After sufficient tine for completed activation of the addressed row (i.e., $t_{RCD}$), the values of CMND0 and CMND1 are each sampled high, and a corresponding command is issued latching a column address and starting the read burst (see Table 2 above). Simultaneously, a column address COL b is provided and registered in the memory device 100 responsive to the positive clock edge T3. The reading of data from the selected memory cells is initiated. Internal to the memory device, the burst counter 116 and column address mux 114 additionally provide three logically adjacent column addresses (b+1, b+2, b+3) which are then registered in the memory device 100 in successive clock cycles. Following sufficient time for signal development and I/O gating of the data stored in the selected memory cells (i.e., "read latency"), data is output on the data bus 130 from each of the four column locations in the activated row in four successive clock cycles. Simultaneously with the provision of the last output data DOUT b+3 at time T9, the accessed row of memory cells is deactivated by RAS transitioning from low to high and initiation of row precharge occurs. Were RAS to instead stay low at time T9 and subsequently, the memory device 100 would enter an idle state in Read mode, as shown in FIG. 7, with the row of memory cells still active and the memory device awaiting commands and addresses corresponding to further read and/or write accesses to that row. Alternatively, were RAS to have transitioned high before the provision of the last output data, the Read Burst would have been terminated, as shown in FIG. 8.

Figure 9:
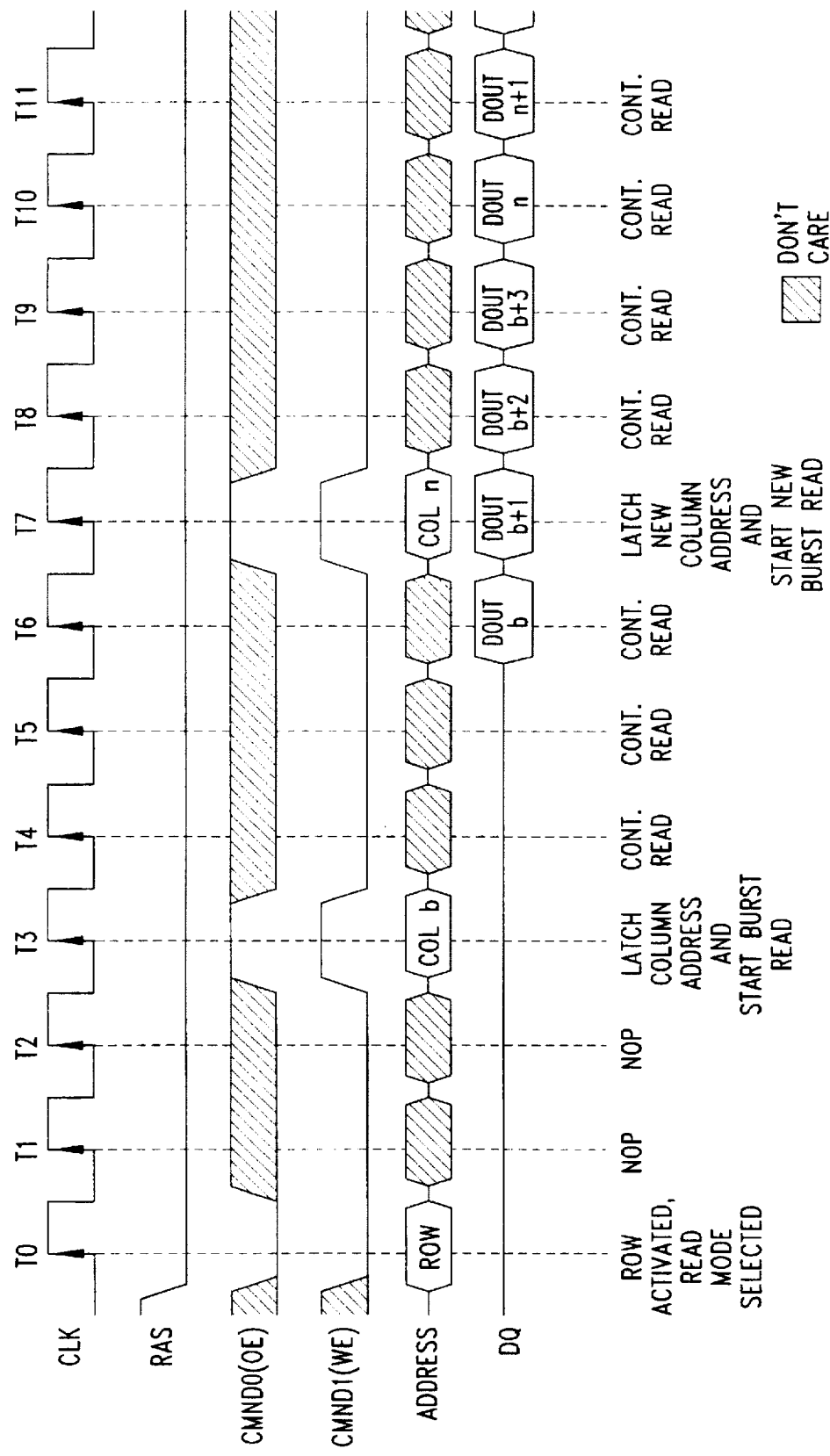
FIG. 9 is a timing diagram showing successive Read Bursts in the memory device of FIG. 3.
Figure 10:
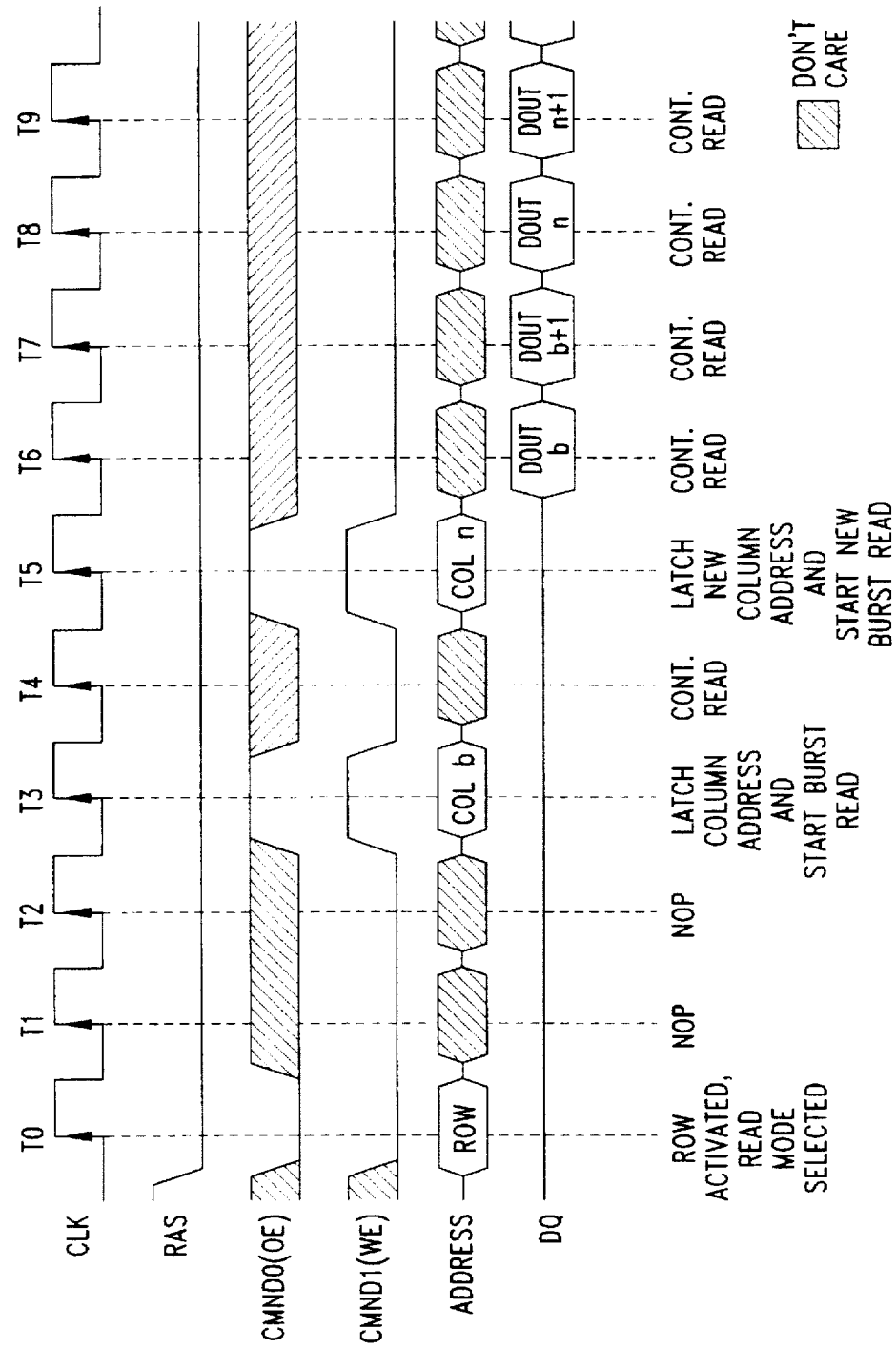
FIG. 10 is a timing diagram showing a Read Burst interrupted by a subsequent Read Burst in the memory device of FIG. 3.

Referring to FIGS. 3 and 9, two successive Read Bursts will now be described. At RAS time T0, activation of an addressed ROW is initiated and a Read mode is selected. Following the row activation period, a first column address COL b is applied to the memory device 100 and registered therein at time T3. Following a number of clock cycles corresponding to the burst size (4 in the described embodiment), a second column address COL n is applied and registered in the memory device 100 at time T7. In this way, data is output on the data bus 130 from activated memory cells in each of eight selected columns in eight successive clock cycles, beginning at time T6 and ending at time T13 (not shown). If the second column address were instead applied to the memory device at an earlier time, this would interrupt the Read Burst associated with the first applied column address. For example, FIG. 10 shows the second column address COL n applied at time T5, two clock cycles after the first column address COL b. In this case, only data from memory cells corresponding with the first two accessed column locations b and b+1 appears on the data bus 150 before data accessed from COL n appears.

Figure 11:
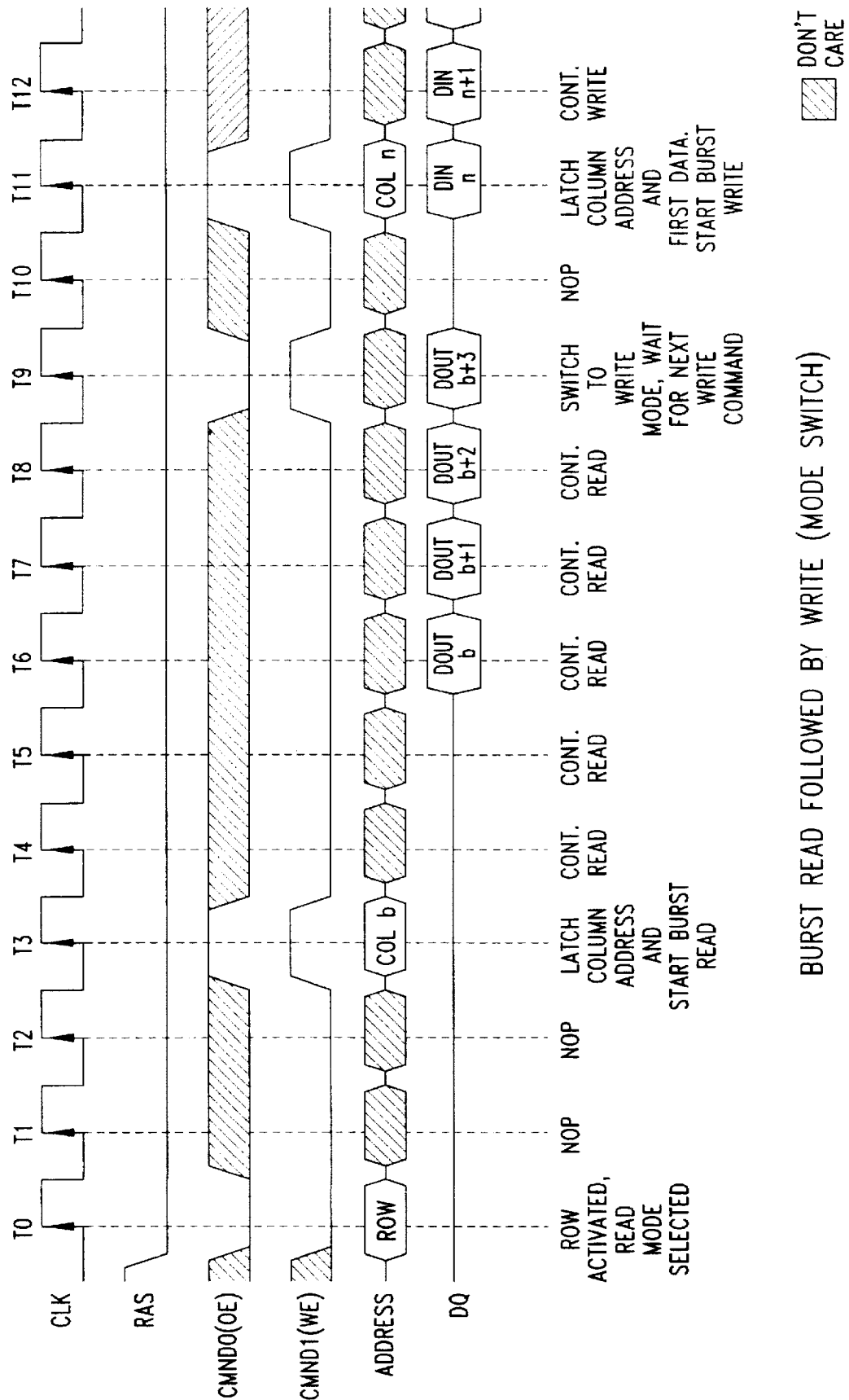
FIG. 11 is a timing diagram showing a Read Burst followed by a Write Burst in the memory device of FIG. 3.
Figure 12:
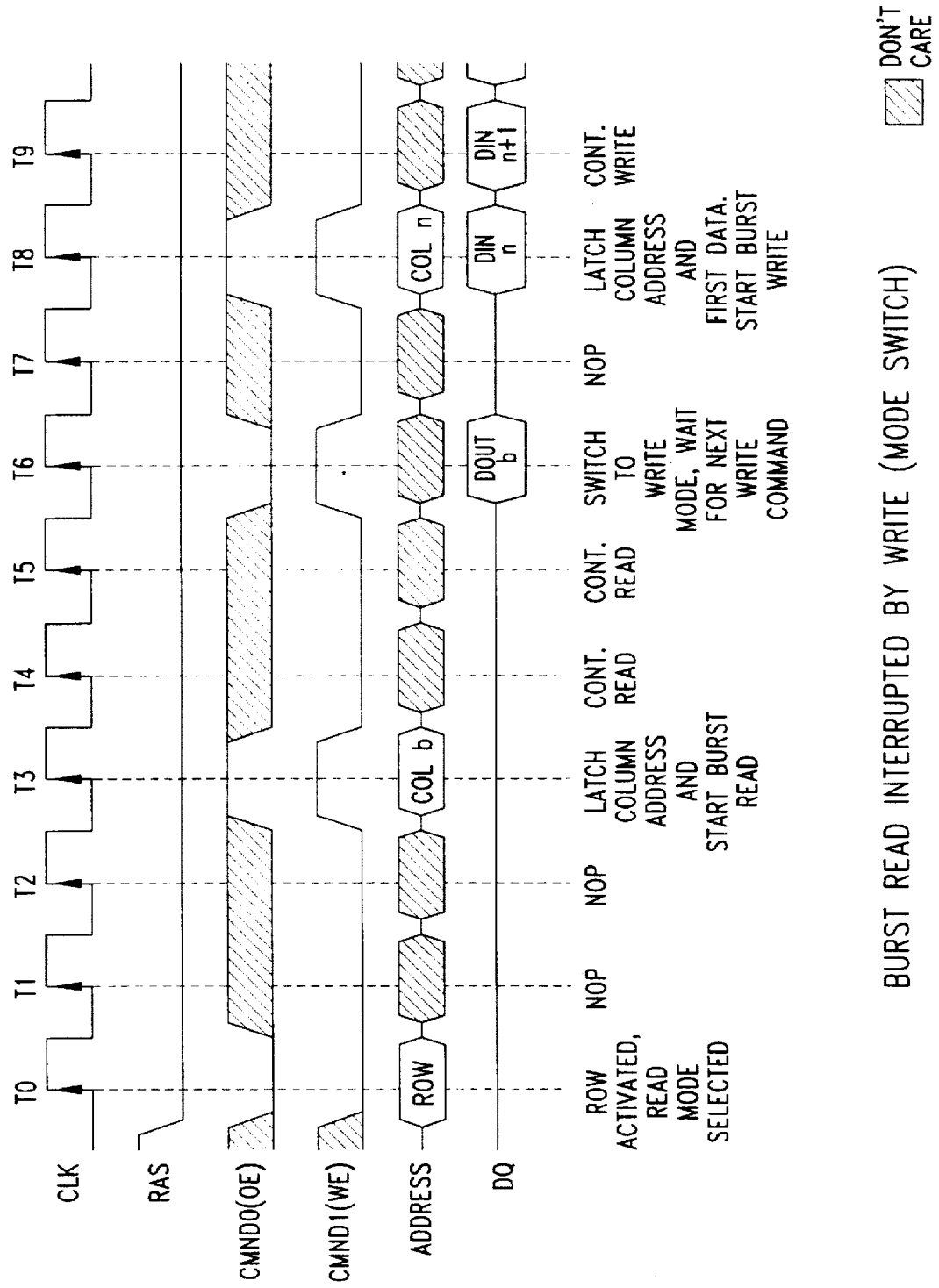
FIG. 12 is a timing diagram showing a Read Burst interrupted by a subsequent Write Burst in the memory device of FIG. 3.
Figure 13:
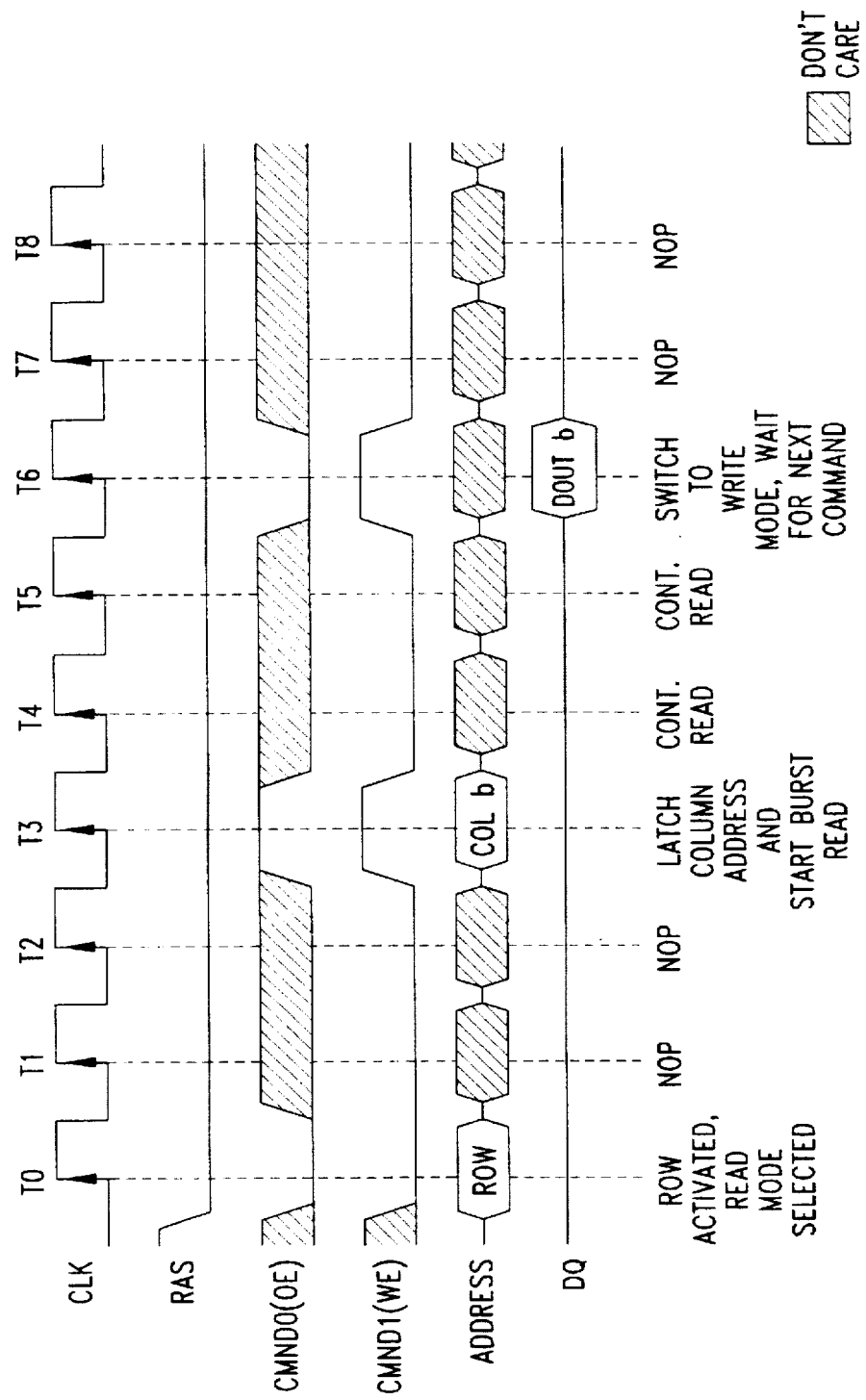
FIG. 13 is a timing diagram showing a Read Burst terminated by a Switch to Write mode command, followed by an idle state in the memory device of FIG. 3.

Referring to FIGS. 3 and 11, a Read Burst followed by a Write Burst will now be described. At RAS time T0, activation of an addressed ROW is initiated and a Read mode is selected. Following the row activation period, a first column address COL b is applied to the memory device 100 and registered therein at time T3. The read data is then made available on the data bus 130 at times T6–T9. At time T9, the command decode circuitry 104 samples CMND0 low and CMND1 high. Referring to Table 2 above, a Switch to Write mode is initiated by control circuit 102. At time TI 1, having allowed sufficient time for the data bus 130 to turn around and for signal development on the global command line carrying CMND0, a column address COL n is provided on the address bus 105 and the first of a burst of four input data elements DIN n is provided simultaneously on the data bus 130. The sampled values of CMND0 high and CMND1 high at this time T11 cause the control circuit 102 to initiate latching of the address and first input data (see Table 2 above). Successively, the remaining input data is provided on the data bus, completing the Write Burst with input data DIN n+3 at time T14 (not shown). If the Switch to Write mode command were instead applied to the memory device at an earlier time, this would interrupt the Read Burst associated with the first applied column address. For example, FIG. 12 shows the Switch to Write mode command applied simultaneously with the appearance of the first read accessed data element DOUT b at time T6, thereby interrupting provision of subsequently accessed data in the Read Burst. Then application of the command to latch column address and input data, together with the column address COL n and the first of a burst of four input data elements DIN n, begins the Write Burst at time T8. If instead no command to latch column address and input data were provided at time T8, the memory device 100 would simply enter an idle state in Write mode, as shown in FIG. 13, with the row of memory cells still active and the memory device awaiting commands and addresses corresponding to further read and/or write accesses to that row.

Figure 14:
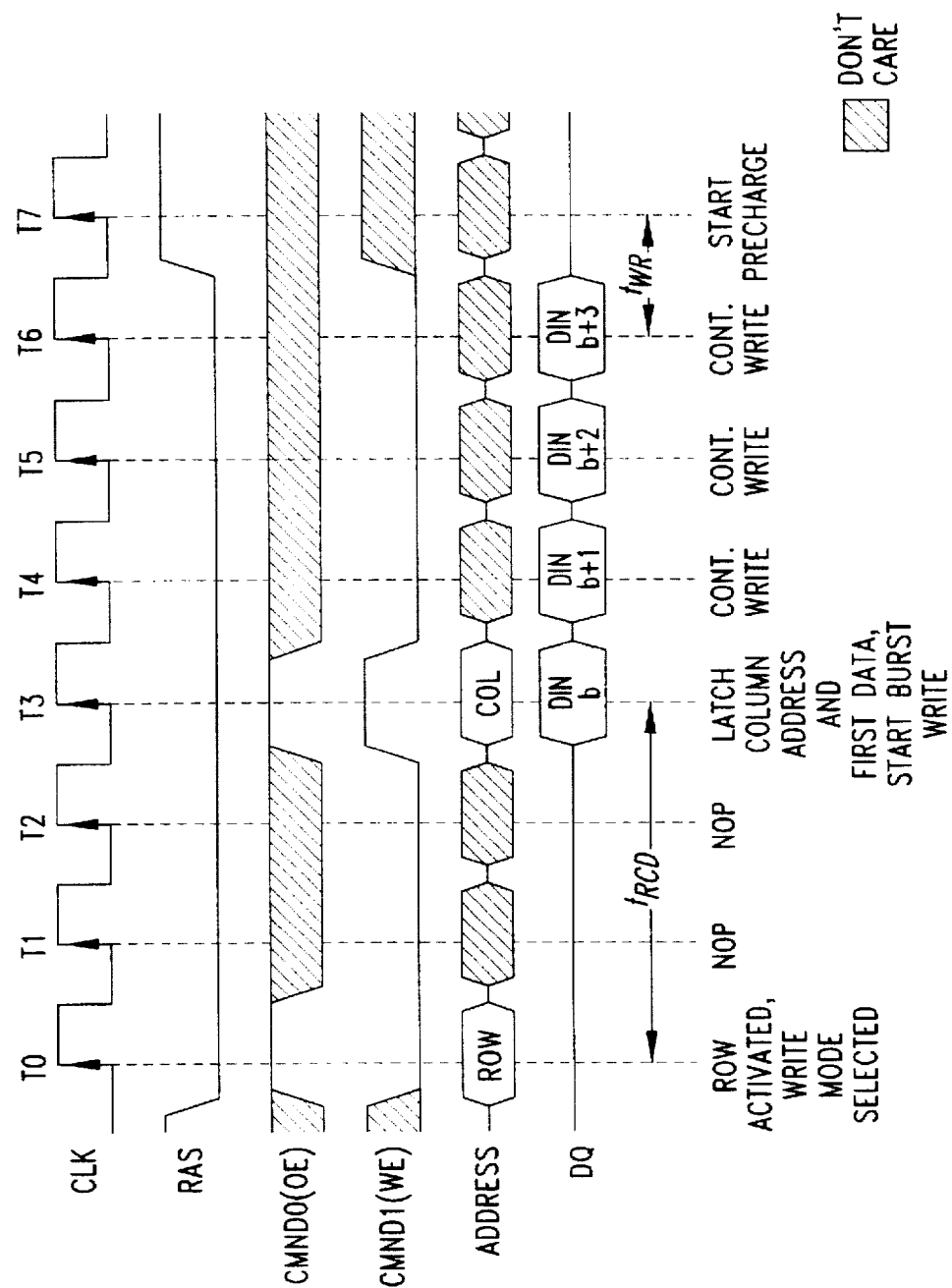
FIG. 14 is a timing diagram showing a Write Burst followed by a precharge operation in the memory device of FIG. 3.
Figure 15:
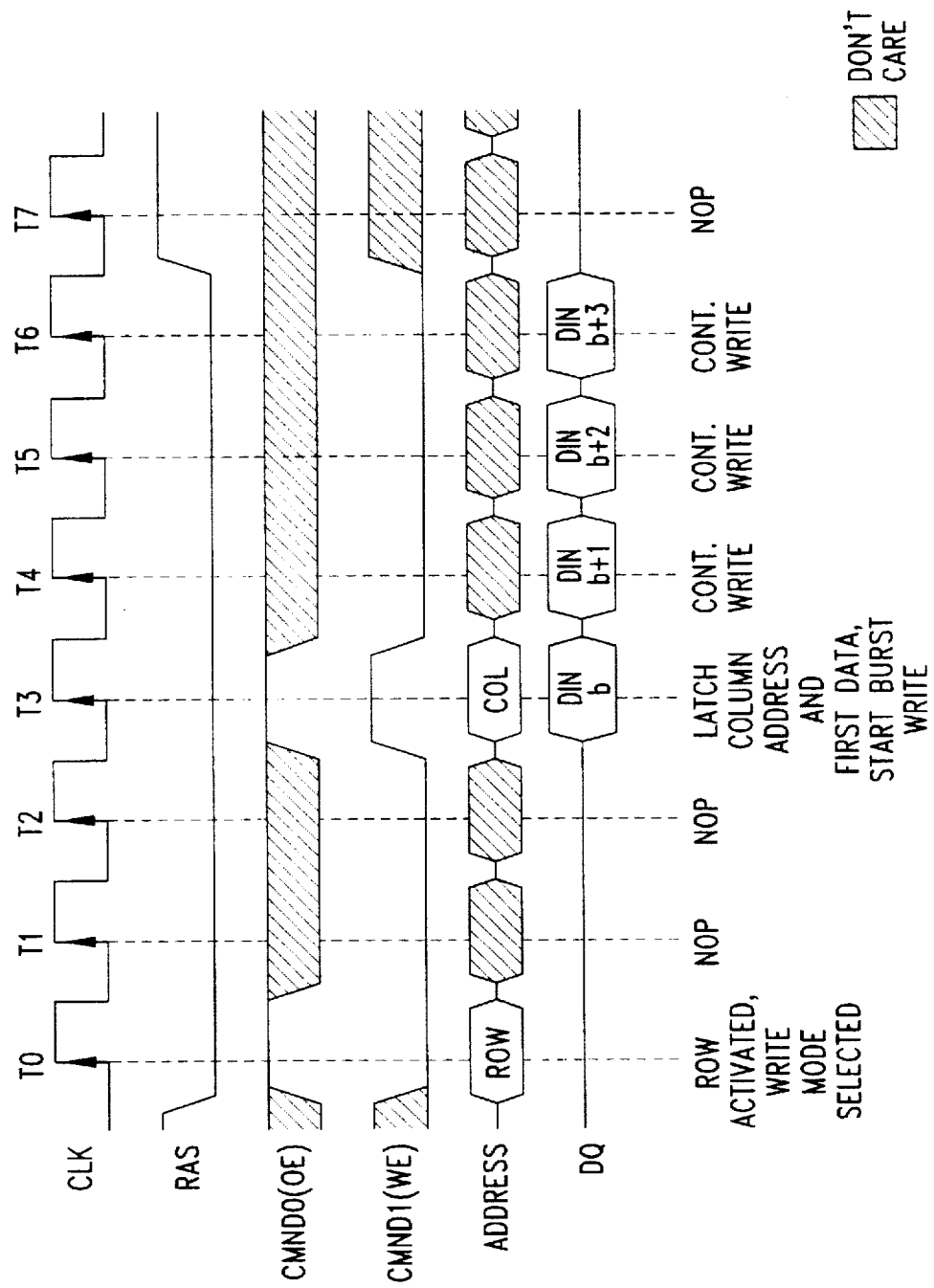
FIG. 15 is a timing diagram showing a Write Burst followed by an idle state in the memory device of FIG. 3.
Figure 16:
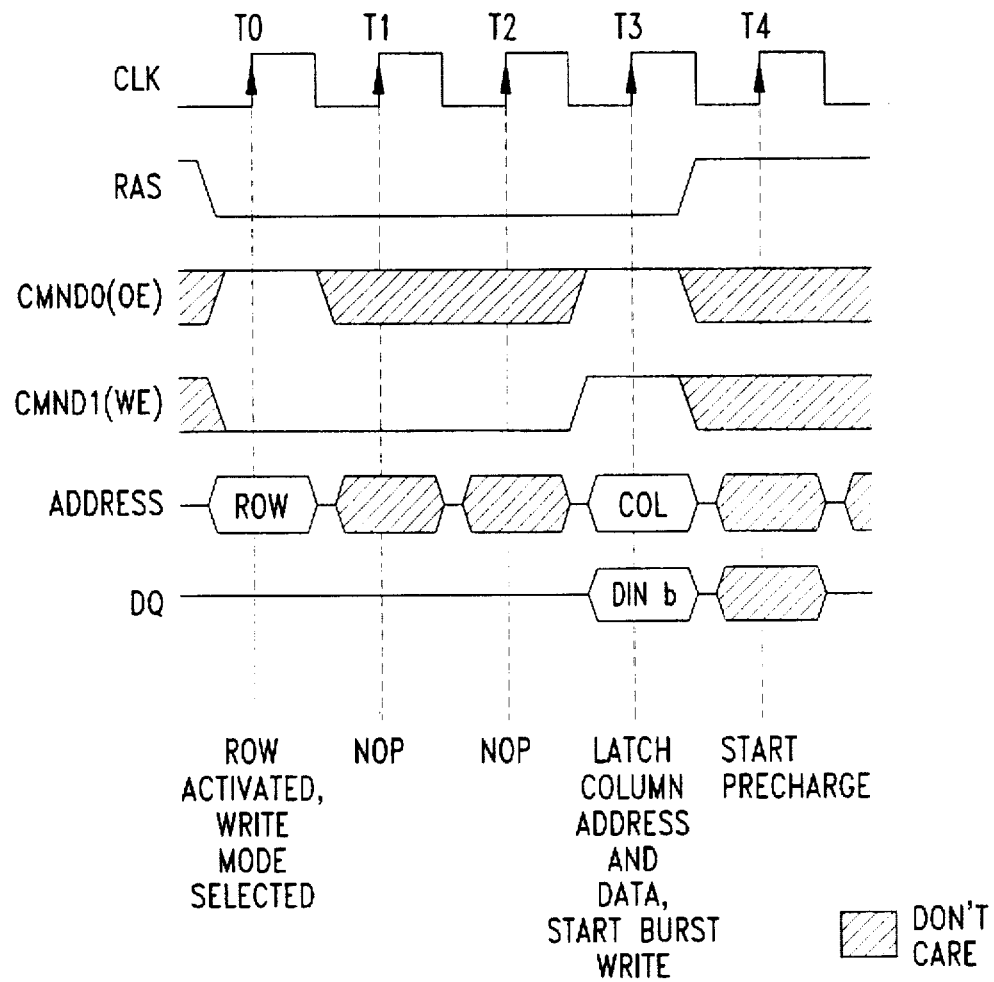
FIG. 16 is a timing diagram showing a Write Burst terminated by a precharge operation in the memory device of FIG. 3.

Referring to FIGS. 3 and 14, a Write Burst will now be described. At RAS time T0, a ROW address is provided on the address bus 105 and activation of a corresponding row of memory cells in the memory array 101 is initiated. Also at RAS time T0, the values of CMND0 and CMND1 are sampled high and low, respectively, causing the subsequent operation of the memory device 100 in Write mode. After sufficient time for completed activation of the addressed row (i.e., $t_{RCD}$), the values of CMND0 and CMND1 are each sampled high, and a corresponding command is issued latching a column address and starting the write burst (see Table 2 above). Simultaneously, a column address COL b is provided on the address bus 105 and input data DIN b is provided on the data bus 130, and the writing of data to the selected memory cells is initiated at time T3. The burst counter 116 and column address mux 114 additionally provide three logically adjacent column addresses COL b+1–COL b+3 internal to the memory device in successive clock cycles, and corresponding input data DIN b+1–DIN b+3 is provided on the data bus 130. One clock cycle after the provision of the last input data DIN b+3 at time T6, the accessed row of memory cells is deactivated by RAS transitioning from low to high and initiation of row precharge occurs. This is consistent with a minimum write recovery time $t_{WR}$ of one clock cycle, as is well known. If instead, the memory device had an internal write latency pipeline, initiation of the precharge step would have to occur correspondingly later. Were RAS to instead stay low at time T6 and subsequently, the memory device 100 would enter an idle state in Write mode, as shown in FIG. 15, with the row of memory cells still active and the memory device awaiting commands and addresses corresponding to further read and/or write accesses to that row. Alternatively, were RAS to have transitioned high before the provision of the last output data, the Write Burst would have been terminated, as shown in FIG. 16.

Figure 17:
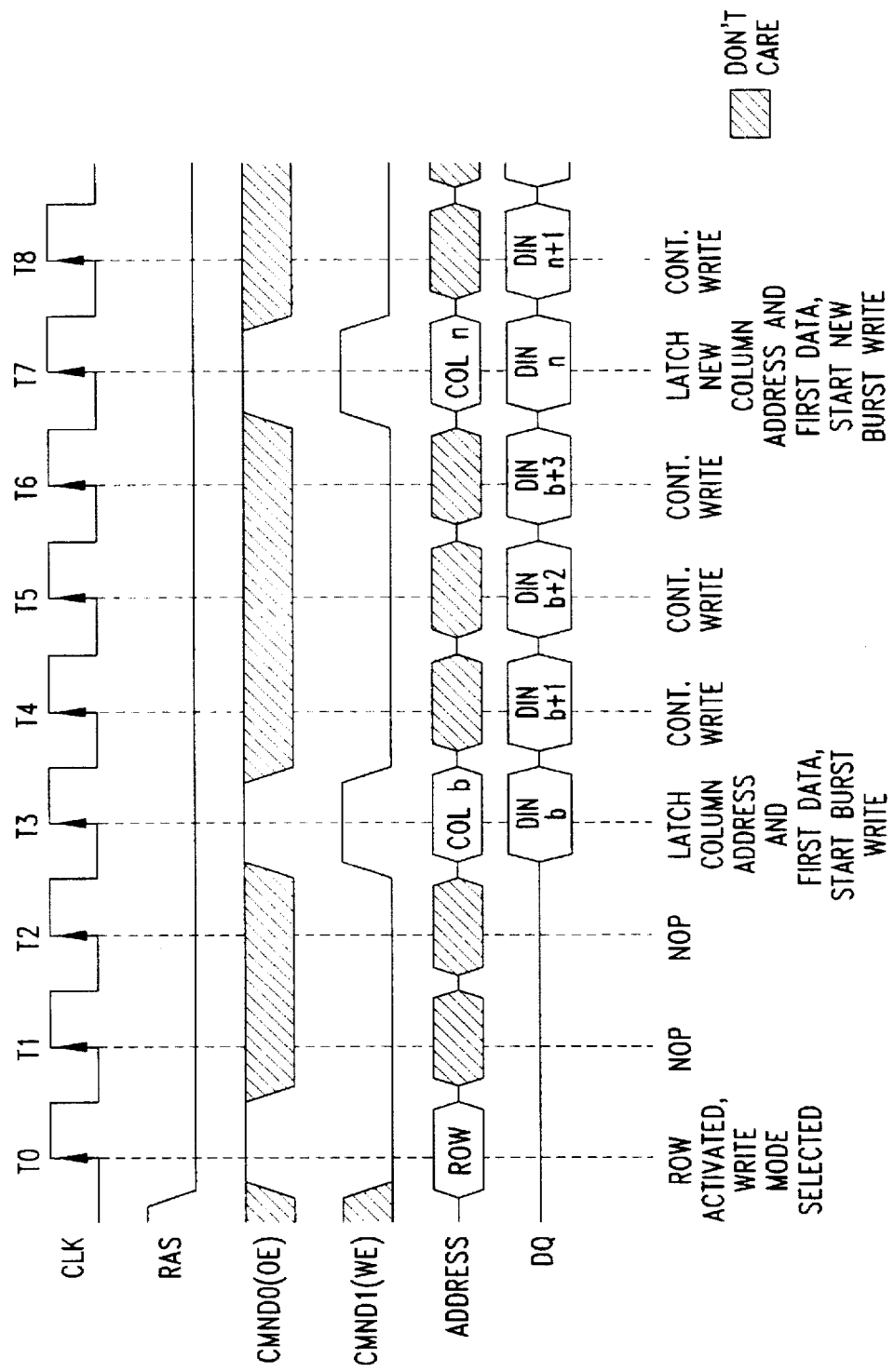
FIG. 17 is a timing diagram showing successive Write Bursts in the memory device of FIG. 3.
Figure 18:
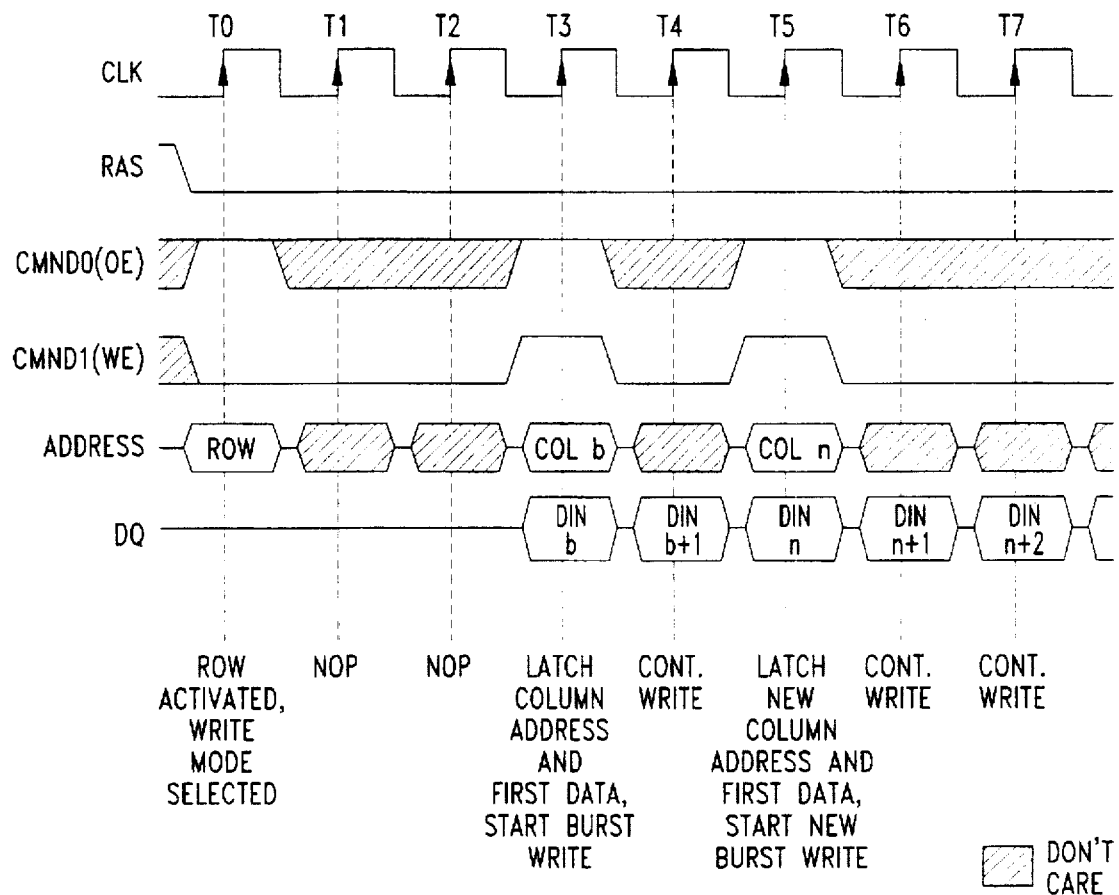
FIG. 18 is a timing diagram showing a Write Burst interrupted by a subsequent Write Burst in the memory device of FIG. 3.

Referring to FIGS. 3 and 17, two successive Write Bursts will now be described. At RAS time T0, activation of an addressed ROW is initiated and a Write mode is selected. Following the row activation period, a first column address COL b is applied to the memory device 100 and registered therein at time T3. Following a number of clock cycles corresponding to the burst size (4 in the described embodiment), a second column address COL n is applied and registered in the memory device 100 at time T7. In this way, data is input on the data bus 130 to activated memory cells in each of eight selected columns in eight successive clock cycles, beginning at time T3 and ending at time T10 (not shown). If the second column address were instead applied to the memory device at an earlier time, this would interrupt the Write Burst associated with the first applied column address. For example, FIG. 18 shows the second column address COL n applied at time T5, two clock cycles after the first column address COL b. In this case, data carried on the data bus 150 may be input only to memory cells corresponding with the first two accessed column locations b and b+1 before data must be input to COL n.

Figure 19:
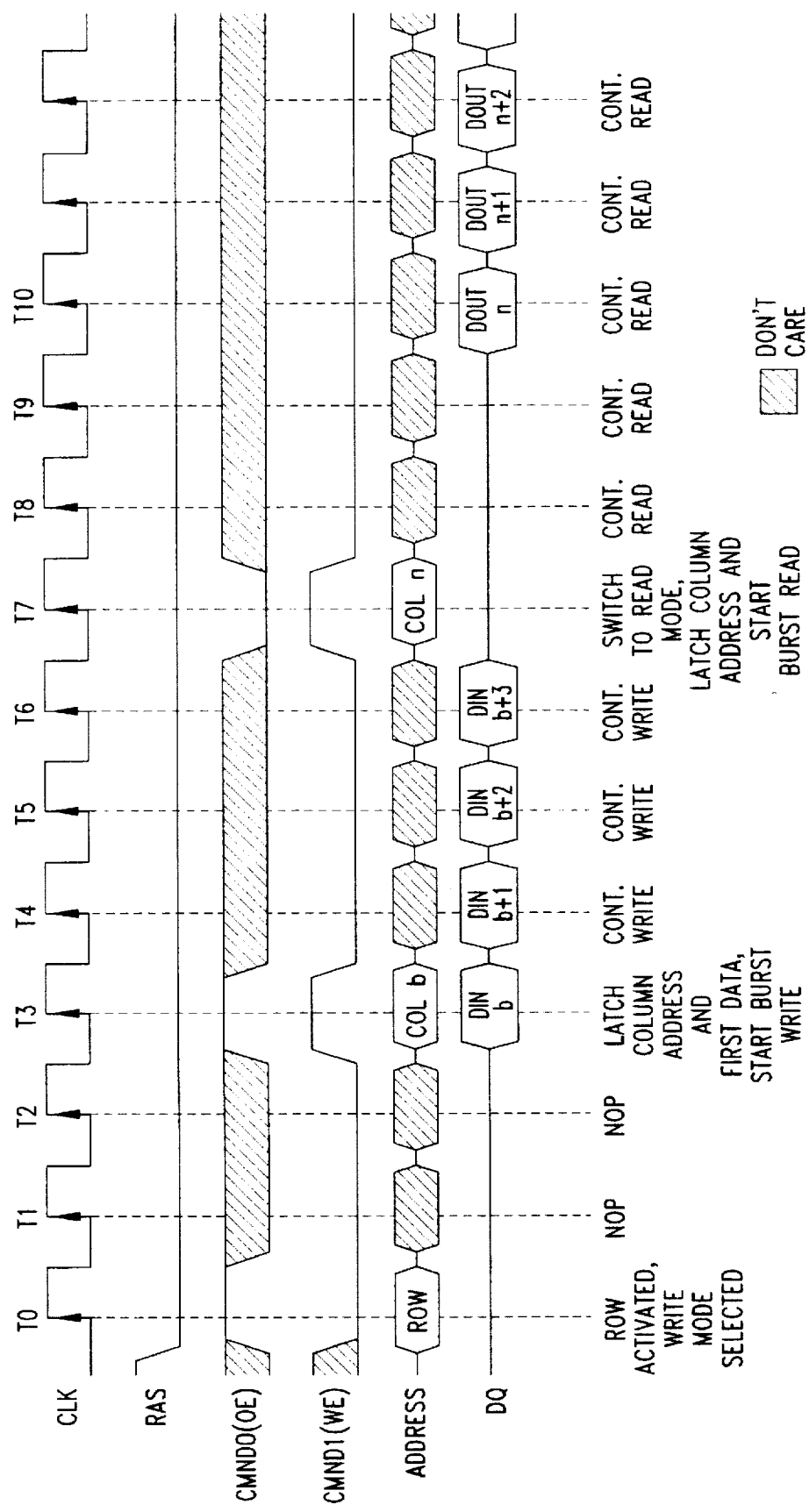
FIG. 19 is a timing diagram showing a Write Burst followed by a Read Burst in the memory device of FIG. 3.
Figure 20:
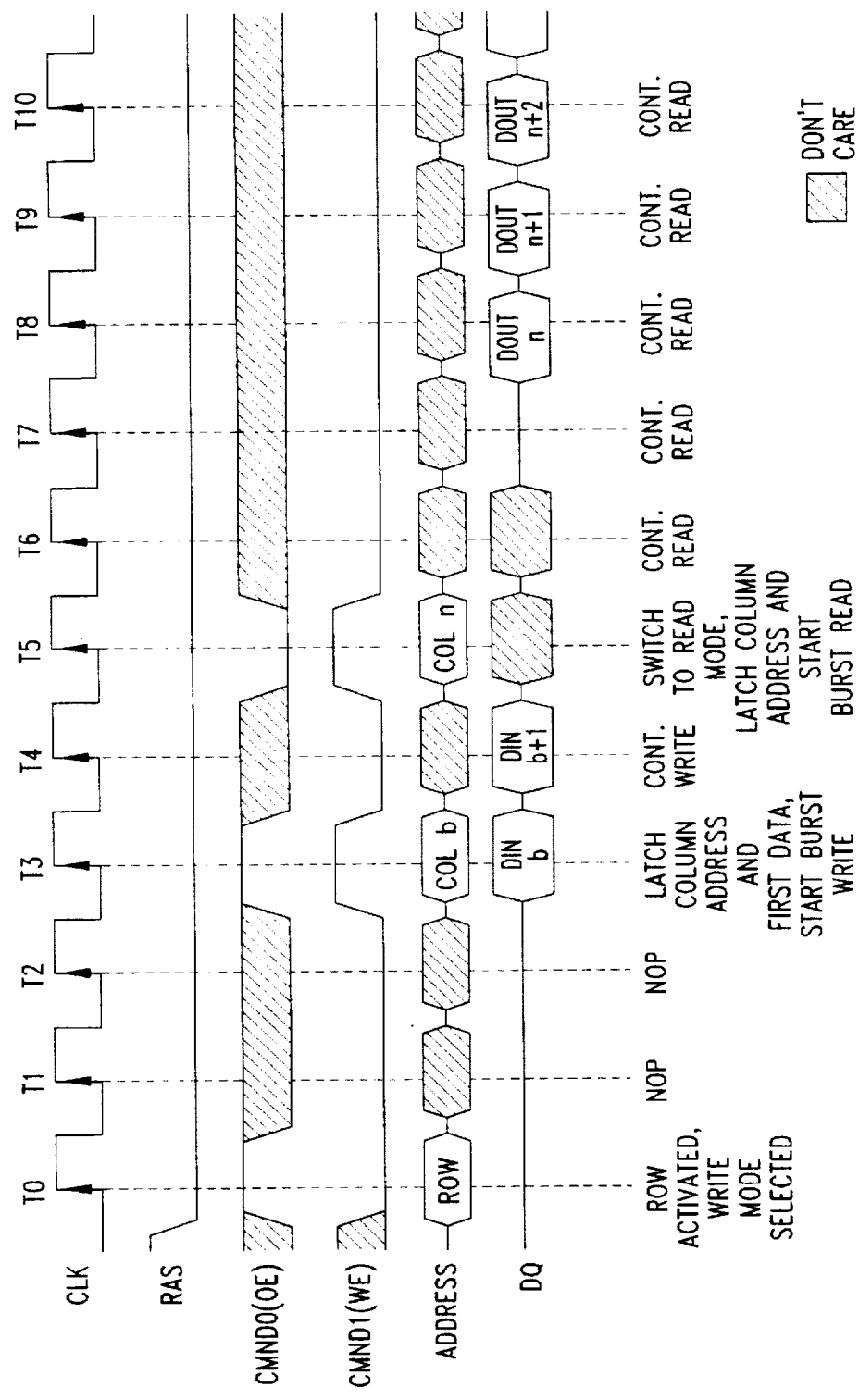
FIG. 20 is a timing diagram showing a Write Burst interrupted by a subsequent Read Burst in the memory device of FIG. 3.
Figure 21:
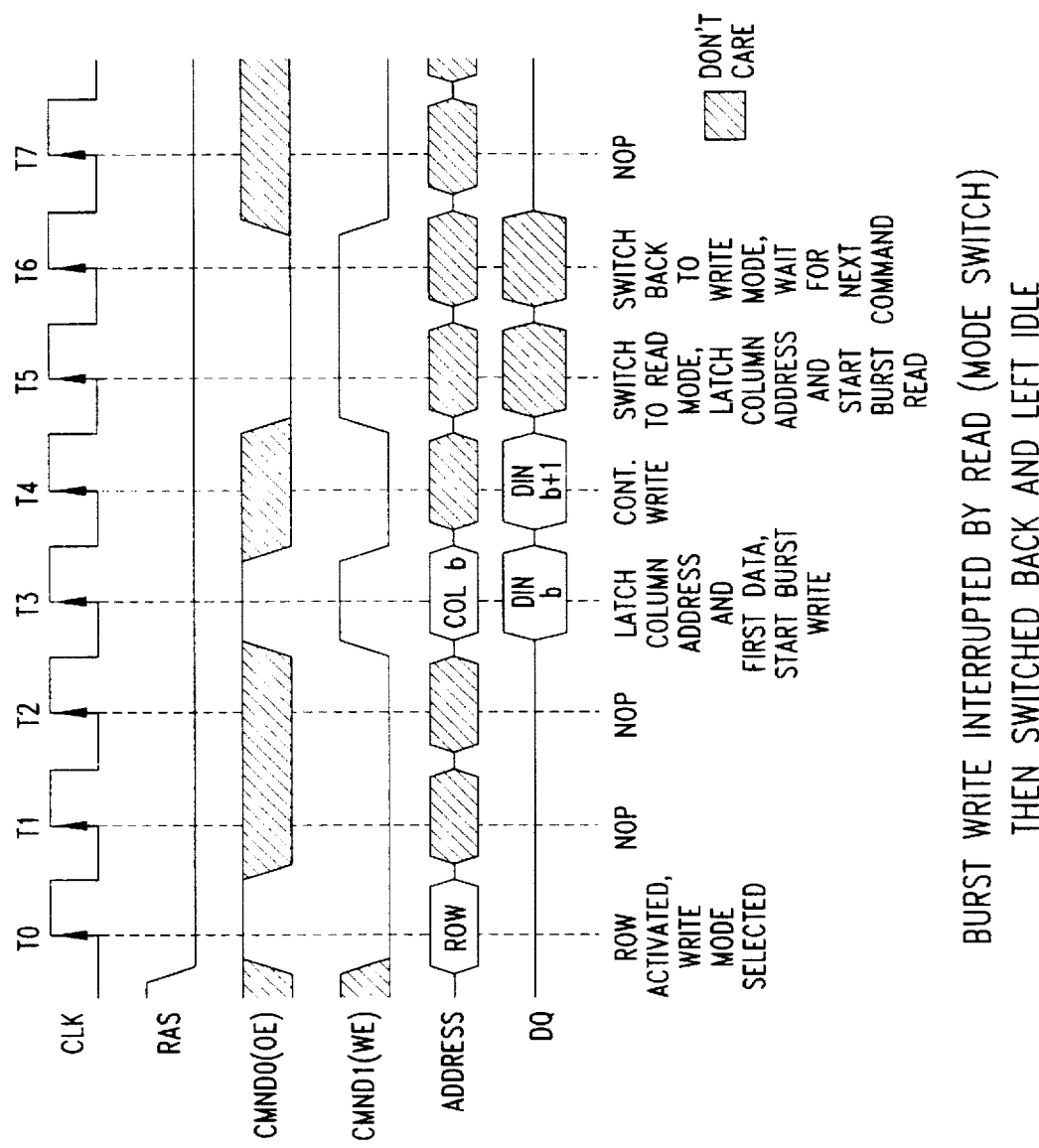
FIG. 21 is a timing diagram showing a Write Burst terminated by a Switch to Read mode command, followed by a Switch to Write mode command, followed by an idle state in the memory device of FIG. 3.

Referring to FIGS. 3 and 19, a Write Burst followed by a Read Burst will now be described. At RAS time T0, activation of an addressed ROW is initiated and a Write mode selected. Following the row activation period, a first column address COL b is applied to the memory device 100, together with the first of a burst of four input data elements on the data bus 130 at time T3. At time T7, the command decode circuitry 104 samples CMND0 low and CMND1 high. Referring to Table 2 above, a Switch to Read mode is initiated by control circuit 102. Simultaneously, a column address COL n provided on the address bus 105 is latched and a Read Burst initiated. Following the read latency period, the first of a burst of four output data elements DOUT n is made available on the data bus 130 at time T10. Successively, the remaining output data is made available on the data bus, completing the Read Burst with output data DOUT n+3 at time T13 (not shown). If the Switch to Read mode command were instead applied to the memory device at an earlier time, this would interrupt the Write Burst associated with the first applied column address. For example, FIG. 20 shows the Switch to Read mode command and the read access column address COL n registered at time T5, following the provision of the second input data element DIN b+1 at time T4. This interrupts the writing to the memory device of subsequent data in the Write Burst at times T5 and T6, even though an external device such as a datapath IC (see FIG. 1) may continue to drive data onto the data bus 130. Following the read latency period, the first of a burst of four output data elements DOUT n, begins the Read Burst at time T8. If instead a Switch to Write mode command was registered at time T6, immediately following the switch to Read command at time T5, the memory device 100 would enter an idle state in Write mode, as shown in FIG. 21, with the row of memory cells still active and the memory device awaiting commands and addresses corresponding to further read and/or write accesses to that row.

Generally it is desirable to have the memory device 100 idling in Write mode, since either a read or write access can occur with a single command and simultaneously latching of a column address. If the memory device 100 instead idles in Read mode, a subsequent write access requires first a Switch to Write mode command followed by a later applied column address, as described above in connection with FIG. 11.

The above-described memory device 100 has the desirable feature of fully interruptible burst operation when operating in either the Read or Write modes. If, however, byte-write capability is deemed more important than write command interruption, the byte-specific command signal CMND1 can be used as a write mask signal. Initiation of a Write Burst would occur as described above. However, each input data element would be applied one clock cycle later than described above. This requirement of a one clock cycle external write latency allows CMND1 to function as the write mask signal—being sampled at each of the positive clock edges at which data is input. However, CMND1 would then be unavailable for purposes of interrupting burst writes, which could only then be terminated by initiation of row precharge. Alternatively, using more pins on the memory controller (see FIG. 1) to provide byte-specific CMND0 signals (as well as byte specific CMND1 signals) would allow for both byte-write and write command interrupt capabilities.

Figure 22:
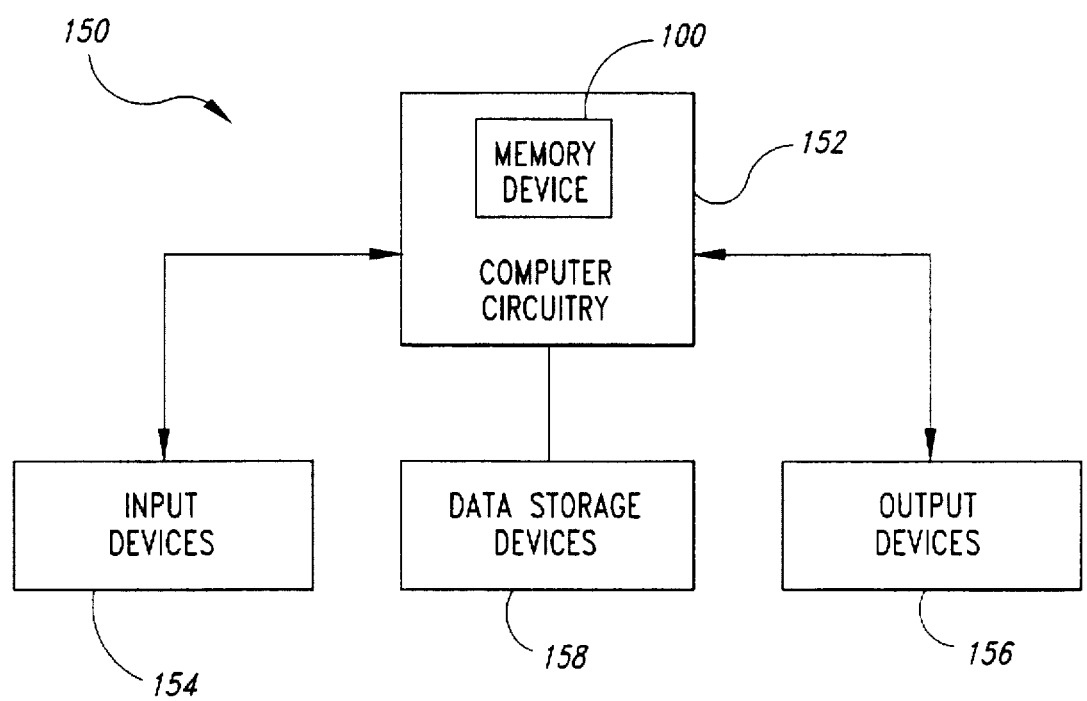
FIG. 22 is a functional block diagram of a computer system according to the present invention.

FIG. 22 is a block diagram of a computer system 150 that uses a memory device 100 according to the present invention. The computer system 150 includes computer circuitry 152 for performing such computer functions as executing software to perform desired calculations and tasks. Circuitry 152 typically contains a processor (not shown) and the memory device 100 as shown. One or more input devices 154, such as a keyboard or a pointing device, is coupled to the computer circuitry 152 and allows an operator (not shown) to manually input data thereto. One or more output devices 156 is coupled to the computer circuitry 152 to provide to the operator data generated by the circuitry. Examples of output devices 156 include a printer and a video display unit. One or more data storage devices 158 is coupled to the computer circuitry 152 to store data on or retrieve data from external storage media (not shown). Examples of storage devices 158 and associated storage media include drives that accept hard and floppy disks, magnetic tape recorders, and compact-disc read only memory (CD-ROM) readers.

It will be appreciated that, although embodiments of the invention have been described above for purposes of illustration, various modifications may be made without deviating from the spirit and scope of the invention. For example, the logic values of various command signals described above and depicted in the accompanying Figures are arbitrary. Further, the above-described application of the novel command signals CMND0 and CMND1 to provide synchronous operation without increased manufacturing or system complexity is applicable to a wide variety of memory devices, such as static random access memories (SRAMs) and non-volatile and flash memories. Accordingly, the invention is not limited except as by the appended claims.

I claim:

1. A method of transferring data between a processor and a memory device having an array of memory cells arranged in rows and columns, comprising the steps of:

applying a system clock signal to the memory device and to the processor;

applying a row activation signal to the memory device, said row activation signal having two logical values;

applying first and second command signals to the memory device, each of said first and second command signals having two logical values;

sampling said row activation signal at regular time intervals determined by said system clock signal;

initiating activation of a row of memory cells identified by a row address in the array in response to sampling a first logical value of said row activation signal;

sampling said first and second command signals;

initiating one of a plurality of selected memory device operating modes in response to sampling a corresponding one of a plurality of logical value combinations of said first and second command signals; and after initiating the selected operating( mode, initiating one of a plurality of selected memory device commands in response to sampling a corresponding one of the plurality of logical value combinations of said first and second command signals.

2. The method of claim 1, wherein said step initiating activation of a row and said step initiating a selected operating mode occur simultaneously.

3. The method of claim 1, wherein said step initiating a selected memory device operating mode includes the step of initiating a selected one of Read and Write modes.

4. The method of claim 1, wherein said step initiating a selected memory device command includes the step of initiating a selected one of Latch Address, NOP, and Switch mode commands.

5. A memory device operable to provide and receive data to and from a processor, the processor functioning responsive to a system clock signal, and the memory device comprising:

an array of memory cells operable to store the data and arranged in rows and columns; and a control circuit operable to receive the system clock signal and a row activation signal, said control circuit operable to sample the row activation signal at regular time intervals determined by the system clock signal, said control circuit further operable to receive first and second command signals and sample the first and second command signals at the regular time intervals and produce a first plurality of control signals to operate the memory device in one of a plurality of operating modes, each corresponding with a respective one of a plurality of logical value combinations of the first and second command signals, and said control circuit operable to subsequently produce a second plurality of control signals to execute one of a plurality of operating commands, each corresponding with a respective one of the plurality of logical value combinations of the first and second command signals.

6. The memory device of claim 5, further comprising a row activation circuit coupled to said control circuit and said array and operable to receive a row address and a row control signal, and operable to decode the row address and activate a row of memory cells identified by the row address in the array in response to the row control signal, and wherein said control circuit is operable to produce the row control signal in response to sampling the row activation signal at a first logical value.

7. The memory device of claim 6, further comprising a column select circuit coupled to said control circuit and said array and operable to receive a column address and one of the second plurality of control signals, and operable to decode the column address and select a set of memory cells identified by the column address in the activated row in response to the one of the second plurality of control signals.

8. The memory device of claim 5, wherein the plurality of operating modes includes Read and Write modes.

9. The memory device of claim 5, wherein the plurality of operating commands includes Latch Address, NOP, and Switch mode commands.

10. A computer system, comprising:

a data input device;

a data output device; and computer circuitry coupled to said data input device and said data output device and including a processor and a memory device each receiving a computer system clock signal, the memory device having:

an address bus;

a data bus;

an array of memory cells operable to store data and arranged in rows and columns;

a row activation circuit coupled to the array and operable to receive a row address, decode the row address, and activate a row of memory cells identified by the row address in the array in response to a first control signal;

a column select circuit coupled to the array and operable to receive a column address, decode the column address, and select a set of memory cells identified by the column address in the activated row in response to a second control signal and a control circuit operable to receive a row activation signal and produce the first control signal in response to registering an asserted row activation signal at an activation time referenced to the computer system clock signal the control circuit also operable to register a Read command or a Write command at the activation time, each of the Read and Write commands corresponding with a respective one of a plurality of logic state combinations of the first and second command signals, the control circuit further operable to register a Latch Address command at a time subsequent to the activation time and to produce the second control signal in response thereto, the Latch Address command corresponding with a respective one of the logic state combinations of the first and second command signals.

11. The computer system of claim 10, further comprising a data storage device coupled to the computer circuitry.

12. The computer system of claim 10 wherein the control circuit is also operable to register a Switch Mode command at a time subsequent to the activation time to switch operation of the memory device from operations associated with the Read command or the Write command to operations associated with the Write command or the Read command, respectively, the Switch Mode command corresponding with a respective one of the logic state combinations of the first and second command signals.

13. The memory device of claim 5 wherein the correspondence between the plurality of operating commands and the logical value combinations of the first and second command signals is determined by the one of the plurality of operating modes in which the memory device is operated.

14. A memory device adapted to transfer data to and from external circuitry, comprising:
a plurality of memory cells operable to store the data; and
a control circuit adapted to receive a clock signal and first and second command signals from the external circuitry, the control circuit operable to sample the first and second command signals at time intervals referenced to the clock signal, the control circuit operable to execute one of a first set of memory device functions, each corresponding with a respective one of a plurality of logical value combinations of the first and second command signals, and said control circuit operable to execute one of a second set of memory device functions, each corresponding with a respective one of the plurality of logical value combinations of the first and second command signals, the second set of memory device functions being distinct from the first set of memory device functions.

15. The memory device of claim 14 wherein the correspondency of the second set of memory device functions with the plurality of logical value combinations depends on a previously executed one of the first set of memory device functions.

16. The memory device of claim 14 wherein execution of one of the second set of memory device functions switches execution from one to another of the first set of memory device functions.

17. The memory device of claim 14 wherein execution of one of the first set of memory device functions includes initiation of one of a Read and Write operating modes.

18. The memory device of claim 14 wherein the plurality of memory cells is arranged in rows and columns, and wherein the control circuit is adapted to receive a row activation signal from the external circuitry and operable to sample the row activation signal at time intervals referenced to the clock signal, the control circuit operable to initiate activation of a selected row of the memory cells in response to a first logic state of the row activation signal at a row activation time.

19. The memory device of claim 18 wherein the control circuit is operable to execute one of the first set of memory device functions at the row activation time, and wherein execution of one of the first set of memory device functions includes initiation of one of a Read and Write operating modes.

20. The memory device of claim 19 wherein execution of one of the second set of memory device functions switches execution from one to another of the Read and Write operating modes.

21. A memory device adapted to transfer data to and from external circuitry, the memory device including an array of memory cells arranged in rows and columns and operable to store data, the memory device comprising:
row address circuitry coupled with the array of memory cells and adapted to receive a row address, the row address circuitry operable to decode the row address and activate a corresponding row of memory cells in response to a first control signal; and
control circuitry adapted to receive a row activation signal and operable to provide the first control signal in response thereto, the control circuit further adapted to receive first and second command signals and to register a plurality of commands, each corresponding to a respective one of a plurality of logic state combinations of the first and second command signals, the correspondency being a function of a previously registered command.

22. The memory device of claim 21, further comprising:
column address circuitry coupled with the array of memory cells and adapted to receive a column address, the column address circuitry operable to decode the column address and select a corresponding one of the activated row of memory cells in response to a second control signal; and
wherein the control circuitry is operable to provide the second control signal in response to registration of a corresponding one of the commands.

23. The memory device of claim 21 wherein the control circuitry is adapted to register a Read command or a Write command at the same time the row activation signal is received.

24. The memory device of claim 23 wherein the control circuitry is adapted to register a Latch Column Address command subsequent to registration of the Read command or the Write command.

25. The memory device of claim 23 wherein the control circuitry is adapted to register a Switch Mode command subsequent to registration of the Read command or the Write command, the control circuitry then operable to change memory device operations from those corresponding with the previously received Read command or Write command to operations corresponding with a Write command or a Read command, respectively.

26. The memory device of claim 21 wherein the control circuitry is adapted to receive a clock signal and operable to produce a plurality of control signals at times referenced to the clock signal to execute memory device operations synchronously with the clock signal.

27. A method of transferring data to and from a memory device having a plurality of memory cells for storing data, comprising the steps of:
receiving a clock signal;
receiving first and second command signals, each having first and second logical values;
sampling the first and second command signals at a first time referenced to the clock signal;
executing one of a first set of memory device commands in response to sampling a corresponding one of a plurality of logic state combinations of the first and second command signals at the first time;
sampling the first and second command signals at a second time referenced to the clock signal; and executing one of a second set of memory device commands in response to sampling a corresponding one of the plurality of logic state combinations of the first and second command signals at the second time, the second set of memory device commands including commands which are distinct from commands included in the first set of memory device commands.

28. The method of claim 27, further comprising the step of:

receiving an activation signal having the first and second logic states;

sampling the activation signal at time intervals referenced to the clock signal; and wherein the step of sampling the first and second command signals at a first time referenced to the clock signal includes the step of sampling the first and second command signals when the activation signal has the first logic state.

29. The method of claim 27 wherein the step of executing one of a first set of memory device commands includes the step of executing one of first and second data transfer modes.

30. The method of claim 27 wherein the step of executing one of a second set of memory device commands includes the step of latching an address identifying one of the plurality of memory cells.

31. The method of claim 27 wherein the step of executing one of a first set of memory device commands includes the step of executing one of first and second data transfer modes, and wherein the step of executing one of a second set of memory device commands includes the step of switching execution from one data transfer mode to another.

32. A method of transferring data to and from a memory device having a plurality of memory cells for storing data, comprising the steps of:

applying a clock signal to the memory device;

applying an activation signal to the memory device;

applying first and second command signals to the memory device, each of the first and second command signals having first and second logic states;

asserting the activation signal at a first time referenced to the clock signal;

applying one of a first set of commands to the memory device at the first time, each of the first set of commands corresponding to a respective one of a plurality of logic state combinations of the first and second command signals; and applying one of a second set of commands to the memory device at a second time referenced to the clock signal, each of the second set of commands corresponding to a respective one of the logic state combinations of the first and second command signals, and each of the second set of commands being distinct from each of the first set of commands.

33. The method of claim 32 wherein the step of applying one of a first set of commands to the memory device at the first time includes the step of applying a Read command or a Write command to the memory device at the first time.

34. The method of claim 32 wherein the step of applying one of a second set of commands to the memory device at a second time includes the step of applying a Switch command to the memory device at the second time, the Switch command modifying the applied one of the first set of commands.

35. In a memory device having an array of memory cells arranged in rows and columns, the memory device adapted to latch a row address at a RAS time in response to an asserted RAS signal, a method of transferring data to and from the memory device comprising the steps of:

applying one of a first and second operating mode commands to the memory device at the RAS time; and applying a switch mode command to the memory device after the RAS time, the switch mode command switching operation of the memory device from a given one of the first and second operating modes to another.

36. The method of claim 35 wherein the step applying one of a first and second operating mode commands to the memory device at the RAS time includes the step of applying one of a Read and Write mode commands to the memory device at the RAS time.

37. A method of modifying an asynchronous memory device to produce a synchronous memory device, including the steps of:

adapting the asynchronous memory device to receive a system clock signal in substitution for a column address strobe signal;

adapting the asynchronous memory device to receive first and second command signals in substitution for an output enable signal and a write enable signal, respectively; and providing a control circuit for registering and decoding a plurality of commands, each encoded by a corresponding one of the plurality logic state combinations of the first and second command signals.

38. The method of claim 37 further comprising the step of adapting the asynchronous memory device to register a Read command or a Write command at a time referenced to the clock signal which coincides with an initial assertion of a row address strobe signal.

39. The method of claim 38 further comprising the step of adapting the asynchronous memory device to register a Latch Column Address command at a time referenced to the clock signal which is subsequent to the initial assertion of the row address strobe signal.

40. The method of claim 38 further comprising the step of adapting the asynchronous memory device to register a Switch Mode command at a time referenced to the clock signal which is subsequent to the initial assertion of the row address strobe signal, the control circuit operable to switch operations from those corresponding with the previously registered Read command or Write command to operations corresponding with the Write command or Read command, respectively.

* * * * *